United States Patent
Ishihara et al.

(10) Patent No.: US 7,727,843 B2
(45) Date of Patent: Jun. 1, 2010

(54) SEMICONDUCTOR ELEMENT, SEMICONDUCTOR STORAGE DEVICE USING THE SAME, DATA WRITING METHOD THEREOF, DATA READING METHOD THEREOF, AND MANUFACTURING METHOD OF THOSE

(75) Inventors: Hiroshi Ishihara, Yokohama (JP); Kenji Maruyama, Kawasaki (JP); Tetsuro Tamura, Kawasaki (JP); Hiromasa Hoko, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/651,108

(22) Filed: Jan. 9, 2007

(65) Prior Publication Data

US 2007/0228432 A1    Oct. 4, 2007

(30) Foreign Application Priority Data

Jan. 13, 2006  (JP) .............................. 2006-005843
Aug. 25, 2006  (JP) .............................. 2006-229896

(51) Int. Cl.
*H01L 21/336* (2006.01)

(52) U.S. Cl. ........................... 438/288; 438/3; 257/295; 257/E21.362; 257/E21.663; 365/49.13

(58) Field of Classification Search .................... 438/3, 438/195, 288; 257/295, 316, E21.362, E21.663; 365/189.011, 49.13
See application file for complete search history.

(56) References Cited

U.S. PATENT DOCUMENTS 5,361,225 A * 11/1994 Ozawa ........................ 365/145

(Continued)

FOREIGN PATENT DOCUMENTS

JP    09-134974 A    5/1997

(Continued)

OTHER PUBLICATIONS

Y. Arimoto et al., "Current Status of Ferroelectric Random-Access Memory", MRS Bulletin Reprinted from Materials Research Society, vol. 29, No. 11, Nov. 2004 pp. 823-828.

(Continued)

*Primary Examiner*—Asok K Sarkar
*Assistant Examiner*—Julia Slutsker
(74) *Attorney, Agent, or Firm*—Westerman, Hattori, Daniels & Adrian, LLP

(57) ABSTRACT

The invention relates to a semiconductor element used for a nonvolatile semiconductor storage device or the like, a semiconductor storage device using the same, a data writing method thereof, a data reading method thereof and a manufacturing method of those, and has an object to provide a semiconductor element in which scaling and integration of cells are possible, storage characteristics of data are excellent, and reduction in power consumption is possible, a semiconductor storage device using the same, a data writing method thereof, a data reading method thereof, and a manufacturing method of those. A pn junction diode GD with a ferroelectric gate as the semiconductor element includes a gate electrode formed on a ferroelectric film, an inversion layer formation region in which an inversion layer is formed in a semiconductor substrate below the ferroelectric film according to a polarization direction of the ferroelectric film, a cathode region formed on one of both sides of the inversion layer formation region, and an anode region formed on the other of both the sides.

20 Claims, 25 Drawing Sheets

U.S. PATENT DOCUMENTS

| | | | |
|---|---|---|---|
| 5,621,681 A | | 4/1997 | Moon |
| 5,936,265 A | | 8/1999 | Koga |
| 6,151,241 A | * | 11/2000 | Hayashi et al. ............. 365/145 |
| 6,753,560 B2 | | 6/2004 | Kato et al. |
| 6,985,386 B1 | * | 1/2006 | Mirgorodski et al. .. 365/185.05 |
| 7,193,451 B2 | * | 3/2007 | Hendrickson ............... 327/199 |
| 2001/0019137 A1 | * | 9/2001 | Koga et al. .................. 257/104 |
| 2004/0080982 A1 | * | 4/2004 | Roizin .................. 365/185.28 |
| 2005/0146942 A1 | * | 7/2005 | Madurawe ............. 365/189.05 |
| 2005/0151210 A1 | * | 7/2005 | Li et al. ....................... 257/410 |
| 2006/0033145 A1 | * | 2/2006 | Kakoschke et al. ......... 257/315 |
| 2006/0081941 A1 | * | 4/2006 | Iwata et al. ................. 257/379 |
| 2006/0097345 A1 | * | 5/2006 | Marr .......................... 257/530 |

FOREIGN PATENT DOCUMENTS

| | | |
|---|---|---|
| KR | 10-141160 B1 | 10/1996 |
| KR | 2002-1622 A | 1/2002 |
| KR | 1020050122728 A | 12/2005 |

OTHER PUBLICATIONS

H. Ishiwara, "Current Status and Prospects in FET-type Ferroelectric Memories", The Journal of the Institute of Electronics, Information and Communication Engineers, vol. 88, No. 4, Apr. 2005 pp. 266-271.

Korean Office Action dated Dec. 18, 2007 (mailing date), issued in corresponding Korean Patent Application No. 10-2007-0002813.

Office Action for Korean Patent Application No. 519980964415 dated Dec. 4, 2009.

Chinese Patent Office Action; Application No. 200710001689X, dated Sep. 5, 2008.

* cited by examiner

|  | WL(V) | BL(V) | DL(V) | PL |
|---|---|---|---|---|
| DATA 0 | $+V_0$ | 0 | $+V_1$ | OPEN |
| DATA 1 | $+V_0$ | $+V_1$ | 0 | OPEN |

FIG.6

|        | WL(V) | BL(V) | DL(V) | PL  | Id (mA) |
|--------|-------|-------|-------|-----|---------|
| DATA 0 | $+V_0$ | $+V_r$ | 0    | GND | $I_0$   |
| DATA 1 | $+V_0$ | $+V_r$ | 0    | GND | $I_1$   |

FIG.15

| CELL SELECTION | | WL(V) | BL(V) | DL(V) | PL | SENSE AMPLIFIER OUTPUT |
|---|---|---|---|---|---|---|
| WRITING | DATA 0 | +V$_0$ | 0 | +V$_1$ | OPEN | N/A |
| | DATA 1 | +V$_0$ | +V$_1$ | 0 | OPEN | N/A |
| READING | DATA 0 | +V$_0$ | +V$_r$ | 0 | GND | +V$_L$ |
| | DATA 1 | +V$_0$ | +V$_r$ | 0 | GND | +V$_H$ |
| CELL NON-SELECTED | | 0 | N/A | N/A | N/A | N/A |

(IN THE CASE WHERE DATA WRITTEN IN REFERENCE CELL IS 0)

SEMICONDUCTOR ELEMENT, SEMICONDUCTOR STORAGE DEVICE USING THE SAME, DATA WRITING METHOD THEREOF, DATA READING METHOD THEREOF, AND MANUFACTURING METHOD OF THOSE

BACKGROUND OF THE INVENTION

1. Field of the Invention

The present invention relates to a semiconductor element used for a nonvolatile semiconductor storage device or the like, a semiconductor storage device using the same, a data writing method thereof, a data reading method thereof and a manufacturing method of those.

2. Description of the Related Art

A nonvolatile random access memory (NVRAM) in which even if the power is turned off, the immediately preceding memory is held and a random access can be made is regarded as promising as a device to form the base of ubiquitous society and in the field of personal identification or security.

Among various nonvolatile RAMs, a nonvolatile memory in which a ferroelectric having spontaneous polarization is used for a dielectric layer of a capacitor is called as ferroelectric random access memory (FeRAM). The FeRAM is expected as a next-generation memory in the mobile field, due to the low power consumption.

The FeRAM currently put to practical use is a 1T1C (1 transistor 1 capacitor) type FeRAM including one cell selection transistor and one data storage ferroelectric capacitor. Even if the power is turned off, since an electric charge remains in the ferroelectric capacitor, the 1T1C-type FeRAM can be used as a nonvolatile storage element.

Patent document 1: JP-A-9-134974

Non-patent document 1: Hiroshi Ishiwara, "Current Status of Development of Transistor-type Ferroelectric Memory and Future Prospects", The Journal of the Institute of Electronics, Information and Communication Engineers, Vol. 88, No. 4, 2005

Non-patent document 2: Yoshihiro Arimoto, Hiroshi Ishiwara, "Current Status of Ferroelectric Random-Access Memory", Reprinted from Materials Research Society MRS Bulletin, Vol. 29, No. 11, November 2004

As described above, in the 1T1C-type FeRAM, one transistor and one ferroelectric capacitor are required in one memory cell, in order to form the memory cell in the FeRAM, a formation region of considerable size is required. Further, since the quantity of electric charge stored in the ferroelectric capacitor is proportional to the electrode area of the ferroelectric capacitor, when the scaling issue of the FeRAM is advanced, the quantity of electric charge necessary for memory storage can not be kept. That is, it is difficult to form a large density of 1T1C-type FeRAM.

In order to solve the problem in the scalability issue of the FeRAM, there is proposed a method in which a 1T (1 transistor)-type FeRAM of an FET-type system is used instead of the 1T1C-type FeRAM. In the FET-type FeRAM, a gate insulating film is formed of a ferroelectric. This configulatin make possible to use nondestructive readout. With the development of the scalability of a transistor, the area of a memory cell can be reduced. Thus, the FET-type FeRAM has an advantage to the 1T1C-type FeRAM in the scaling capability. However, in the FET-type FeRAM, under present circumstances, a voltage for writing data into a memory cell or reading data stored in the memory cell is high, and the reliability of a gate insulating film is low. Accordingly, the FET-type FeRAM is inferior to the current 1T1C-type FeRAM in retention characteristics indicating the memory storage performance and disturbance characteristics at the time of memory cell selection, and it has not been put to practical use.

A typical FET-type 1T FeRAM has a structure in which a gate insulating film (I), a ferroelectric film (F) and an electrode film (M) are stacked over a channel region of a semiconductor substrate (S) in which a source region and a drain region are formed. The FET having this structure is called an MFIS-type FET. In the FET-type 1T FeRAM, by using a fact that an on current and an off current between the source and drain are different by several digits according to the polarization direction of the ferroelectric film, it is read out whether the stored data is "0" or "1".

FIG. 27 is a view for explaining data writing of a memory array of an FET-type 1T FeRAM. As shown in FIG. 27, the memory array of the FET-type 1T FeRAM includes plural memory cells arranged in a matrix form. In the memory array of the FET-type 1T FeRAM, at the time of data writing, for example, +V (V) is applied to a word line 151 connected to a gate electrode of a selected cell 150, and for example, 0 (V) is applied to a bit line 153 connected to a drain electrode. At that time, +($\frac{1}{3}$)V (V) is applied to word lines 151 connected to gate electrodes of non-selected cells 152 and 154, and for example, +($\frac{2}{3}$)V (V) is applied to bit lines 153 connected to drain electrodes thereof. That is, it is necessary to apply the voltage to the gate electrodes of all non-selected cells.

By this, the voltage of +V (V) is applied to the ferroelectric film of the FeRAM of the selected cell 150. The voltage of +($\frac{1}{3}$)V (V) is applied to the ferroelectric film of the FeRAM of the non-selected cell 154 connected to one of the word line 151 and the bit line 153 to which the selected cell 150 is connected. The voltage of −($\frac{1}{3}$)V (V) is applied to the ferroelectric film of the FeRAM of the non-selected cell 152 connected to the word line 151 or the bit line to which the selected cell 150 is not connected. Accordingly, electric power is consumed also in the non-selected cells 152 and 154 by leak current, and further, since the voltage is applied to all the bit lines and word lines at each writing of one bit, when the cell size becomes large, charging/discharging current of these wiring lines becomes enormous. As stated above, in the semiconductor storage device including the FET-type 1T FeRAM, it is difficult to reduce power consumption.

FIG. 28A and FIG. 28B are views for explaining data reading of the memory array of an n-type FET-type 1T FeRAM. In an MFIS-type FET, in order to hold data for a long period, in the case where 0 (V) is applied to a gate electrode, it is necessary that a difference in the magnitude of a current flowing between a source and a drain is realized according to the polarization direction of a ferroelectric film. FIG. 28A shows a parallel memory array, and FIG. 28B shows a serial memory array. As shown in FIG. 28A, in the parallel memory array in which plural source electrodes are connected to each other and plural drain electrodes are connected to each other, at the time of data reading, a voltage of −V (V) is applied to the gate electrodes of all non-selected cells 152 to cause the non-selected FET to have high resistance, and 0(V) is applied to the gate electrode of a selected cell 150 to read the magnitude of the current flowing between the source and drain of the selected FET from a peripheral circuit. On the other hand, as shown in FIG. 28B, in the serial memory array in which the source electrode and drain electrode of adjacent FET-type 1T FeRAMs are connected, +V (V) is applied to gate electrodes of all non-selected cells 152 to cause the non-selected FETs to have low resistance, and 0 (V) is applied to the gate electrode of a selected cell 150 to read information of the magnitude of current flowing between the source and drain of the selected FET from a peripheral circuit.

As stated above, in the FET-type 1T FeRAM, at the time of writing and reading of data, since it is necessary to apply the predetermined voltages to both the selected cell and the non-selected cell, it is difficult to reduce the power consumption of the semiconductor storage device. Besides, a possibility that the memory data of the non-selected cell is rewritten becomes high, and the reliability is low.

As is apparent from the above description, the 1T1C-type FeRAM has the problem that the scaling is difficult. Besides, the FET-type 1T FeRAM has the problem that the retention characteristics and the disturb characteristics as the memory element are not satisfactory. Besides, the FET-type 1T FeRAM has the problem that it is difficult to reduce the power consumption of the semiconductor storage device.

SUMMARY OF THE INVENTION

An object of the invention is to provide a semiconductor element in which scaling and integration of cells are possible, storage characteristics of data are excellent, and reduction in power consumption is possible, a semiconductor storage device using the same, a data writing method thereof, a data reading method thereof, and a manufacturing method of those.

The object is achieved by a semiconductor element including a ferroelectric film formed above a semiconductor substrate, a gate electrode formed on the ferroelectric film, an impurity activated region formed below the ferroelectric film, a high concentration n-type impurity activated region formed on one of both sides of the impurity activated region, and a high concentration p-type impurity activated region formed on the other of both the sides.

Besides, the object is achieved by a semiconductor storage device including a memory cell to store data according to a polarization direction of a ferroelectric film, in which the memory cell includes the semiconductor element of the above invention, and a cell selection transistor including a gate electrode, a source region, and a drain region, and the p-type impurity activated region or the n-type impurity activated region is connected to one of the source region and the drain region.

Besides, the object is achieved by a semiconductor storage device including a memory cell to store data according to a polarization direction of a ferroelectric film, in which the memory cell includes a semiconductor element that includes a ferroelectric film formed above a semiconductor substrate, a gate electrode formed on the ferroelectric film, an inversion layer formation region in which an inversion layer is formed in the semiconductor substrate below the ferroelectric film according to the polarization direction of the ferroelectric film, a cathode region formed on one of both sides of the inversion layer formation region, and an anode region formed on the other of both the sides, and a cell selection transistor that includes a gate insulating film formed on the semiconductor substrate, a gate electrode formed on the gate insulating film, a source region and a drain region formed on both sides of a channel region of the semiconductor substrate in a lower layer of the gate insulating film, and one of the cathode region and the anode region of the semiconductor element is electrically connected to one of the source region and the drain region of the cell selection transistor.

The above object is achieved by a manufacturing method of a semiconductor storage device including a memory cell to store data according to a polarization direction of a ferroelectric film, which includes forming a semiconductor element by forming a ferroelectric film above a semiconductor substrate, by forming a gate electrode on the ferroelectric film, and by forming a cathode region on one of both sides of an inversion layer formation region of the semiconductor substrate below the ferroelectric film and an anode region on the other, forming a cell selection transistor by forming a gate insulating film on the semiconductor substrate, by forming a gate electrode on the gate insulating film, and by forming a source region and a drain region on both sides of a channel region of the semiconductor substrate in a lower layer of the gate insulating film, and forming the memory cell by connecting one of the cathode region and the anode region to one of the source region and the drain region.

The above object is achieved by a semiconductor storage device including a memory cell to store data according to a polarization direction of a ferroelectric film, in which the memory cell includes a storage semiconductor element that includes a well region formed on a semiconductor substrate of a first conductivity type and having a second conductivity type different from the first conductivity type, a ferroelectric film formed above the well region, a gate electrode formed on the ferroelectric film, an inversion layer formation region in which an inversion layer is formed in the well region below the ferroelectric film according to the polarization direction of the ferroelectric film, a first impurity activated region of the first conductivity type formed on one of both sides of the inversion layer formation region, and a second impurity activated region of the first conductivity type formed on the other of both the sides, and a cell selection transistor that includes a gate insulating film formed on the semiconductor substrate, a gate electrode formed on the gate insulating film, a third impurity activated region of the second conductivity type formed on one of both sides of a channel region of the semiconductor substrate in a lower layer of the gate insulating film and electrically connected to the well region and the second impurity activated region, and a fourth impurity activated region of the second conductivity type formed on the other of both the sides of the channel region.

According to the invention, it is possible to realize the semiconductor element in which the scaling and integration of the cells are possible, the storage characteristics of data and the reliability are excellent, and the reduction in power consumption is possible, and the semiconductor storage device using the same.

BRIEF DESCRIPTION OF THE DRAWINGS

FIG. 6 is a table showing applied voltages to respective lines WL, BL, DL and PL at the time of data reading of the semiconductor storage device 1 according to the first embodiment of the invention;

FIG. 15 is a table showing applied voltages to the respective lines WL, BL, DL and PL at the time of data writing/reading of the semiconductor storage device 1 according to the first embodiment of the invention and outputs of a sense amplifier in the case where 1-bit data of "0" has been written in a reference memory cell;

DETAILED DESCRIPTION OF THE INVENTION

First Embodiment

A semiconductor element, a semiconductor storage device using the same, a data writing method thereof, a data reading method thereof, and a manufacturing method thereof will be described with reference to FIG. 1 to FIG. 18B.

The semiconductor element of this embodiment is a pn junction diode with a ferroelectric gate, and is characterized in that the polarization direction of a ferroelectric film is inverted according to the positive/negative (polarity) of a voltage applied to a gate electrode, and the magnitude of a current flowing at the time of application of a reverse bias voltage varies according to the polarization direction. Besides, the semiconductor storage device of the embodiment includes a memory cell that includes a cell selection transistor and a pn junction diode with a ferroelectric gate electrically connected to the cell selection transistor, and is characterized in that the polarization direction of a ferroelectric film of the pn junction diode with the ferroelectric gate is inverted to write 1-bit data corresponding to "0" or "1", and 1-bit data corresponding to "0" or "1" is read according to the magnitude of a current flowing according to the polarization direction.

Figure 1:
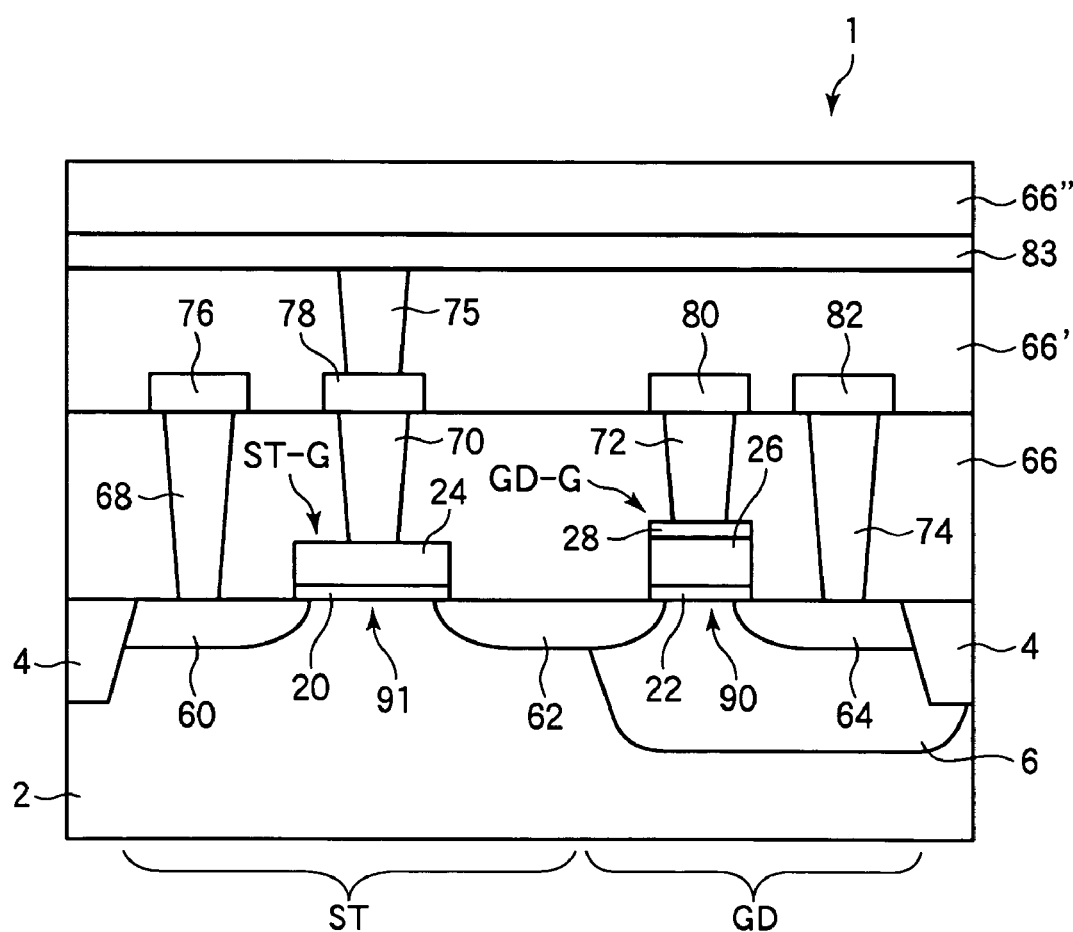
FIG. 1 is a view showing a pn junction diode GD with a ferroelectric gate according to a first embodiment of the invention and a structure of a semiconductor storage device 1 using the same.

First, the pn junction diode GD with the ferroelectric gate according to the embodiment and the structure of the semiconductor storage device 1 using the same will be described with reference to FIG. 1. FIG. 1 shows a sectional structure, perpendicular to the substrate surface, of one memory cell of the semiconductor storage device 1 of the embodiment in which a cell selection transistor ST is connected to the pn junction diode GD with the ferroelectric gate. As shown in FIG. 1, the memory cell of the semiconductor storage device 1 is formed in an element region defined by an element isolation insulating film 4 formed on a p-type silicon semiconductor substrate 2. A p-type impurity activated region of the p-type silicon semiconductor substrate 2 and an n ("−" indicates minus) well 6 of a low concentration n-type impurity activated region are formed in the element region.

The cell selection transistor ST of an n-type FET used for cell selection is formed in the p-type impurity activated region in the element region defined by the element isolation insulating film 4. The pn-junction diode GD with the ferroelectric gate in which a ferroelectric film for storing 1-bit data of "0" or "1" by the direction of residual polarization is provided in a gate portion is formed in the n⁻ well 6.

A gate portion GD-G of the pn junction diode GD with the ferroelectric gate includes a gate insulating film 22 of an $HfO_2$ (hafnium oxide) film having a thickness of 4 nm and formed on an n⁻ impurity region of the n⁻ well 6, a data storage ferroelectric film 26 of an SBT ($SrBi_2Ta_2O_9$: strontium bismuth tantalate) film having a thickness of 400 nm and formed on the gate insulating film 22, and a gate electrode 28 of a Pt (platinum) film having a thickness of 100 nm and formed on the ferroelectric film 26.

The pn junction diode GD with the ferroelectric gate includes an inversion layer formation region 90 in which an inversion layer is formed in the n⁻ well 6 of the semiconductor substrate 2 below the ferroelectric film 26 according to the polarization direction of the ferroelectric film 26. A cathode region (hereinafter, if necessary, referred to as "n-type impurity diffusion layer" or "cathode region") 62 of an n-type impurity diffusion layer (n-type impurity activated region) is formed on one (left side in FIG. 1) of both sides of the inversion layer formation region 90, and an anode region (hereinafter, if necessary, referred to as "p-type impurity diffusion layer" or "anode region") 64 of a p-type impurity diffusion layer (p-type impurity activated region) is formed on the other (right side in FIG. 1). The cathode region 62 is the n-type impurity diffusion layer with a concentration higher than the n⁻ well 6. The anode region 64 is the p-type impurity diffusion layer with a concentration higher than the p-type impurity activated region of the semiconductor substrate 2.

In the state where the inversion layer is not formed in the inversion layer formation region 90, the pn junction diode GD with the ferroelectric gate can be regarded as a p⁺n⁻ junction diode in which the anode region 64 and the n⁻ well 6 are connected to each other. Besides, in the state where the inversion layer is formed in the inversion layer formation region 90, the pn junction diode GD with the ferroelectric gate can be regarded as a p⁺n⁺ junction diode in which the anode region 64 and the cathode region 62 are connected to each other through the inversion layer which can be regarded as a high concentration p-type layer.

A gate portion ST-G of the cell selection transistor ST includes a gate insulating film 20 of an $HfO_2$ film of 4 nm formed on the p-type impurity region of the semiconductor substrate 2, and a gate electrode 24 of a polysilicon film of 150 nm formed on the gate insulating film 20. A drain/source region (hereinafter, if necessary, referred to as "n-type impurity diffusion layer" or "drain region") 60 of an n-type impurity diffusion layer with an impurity concentration almost equal to that of the cathode region 62 is formed on one (left side in FIG. 1) of both sides of a channel region 91 formed in the semiconductor substrate 2 of a lower layer of the gate insulating film 20 of the gate portion ST-G.

The n-type impurity diffusion layer 62 as the cathode region of the pn junction diode GD with the ferroelectric gate extends to the other (right side in FIG. 1) of both sides of the channel region 91 of the lower layer of the gate insulating film 20 of the gate portion ST-G of the cell selection transistor ST from the n⁻ well 6 and is used also as a source/drain region (hereinafter, if necessary, referred to as "source region") of the cell selection transistor ST.

As stated above, the n-type impurity region 62 constitutes the cathode region of the pn junction diode GD with the ferroelectric gate, and at the same time, constitutes the source region of the cell selection transistor ST. In this embodiment, the cathode region of the pn junction diode GD with the ferroelectric gate and the source region of the cell selection transistor ST are integrally formed and are electrically connected to each other. However, it is a matter of course that these are isolated from each other and may be electrically connected. In the case where the cathode region and the source region are isolated, a connection process for connecting both the regions is required.

A silicide film (not shown) is formed on the respective upper layer portions of the gate electrode 24 of the polysilicon film of the gate portion ST-G of the cell selection transistor ST, the n-type impurity diffusion layers 60 and 62, and the p-type impurity diffusion layer 64.

A not-shown silicon oxynitride (SiON) film with a thickness of about 200 nm is formed as a cover film on the whole surface of the semiconductor substrate 2, and an interlayer insulating film 66 of dioxide silicon ($SiO_2$) with a thickness of about 1.0 μm is formed thereon. The surface of the interlayer insulating film 66 is flattened. The interlayer insulating film 66 of upper layer portions of the gate electrode 24 of the polysilicon film of the gate portion ST-G of the cell selection transistor ST, the drain region 60 of the cell selection transistor ST and the gate electrode 28 and the anode region 64 of the pn junction diode GD with the ferroelectric gate are opened, and contact holes are formed. For example, tungsten is embedded in the respective contact holes, and tungsten plugs 68, 70, 72 and 74 are formed. Predetermined wiring lines 76, 78, 80 and 82 are respectively formed on the tungsten plugs 68, 70, 72 and 74.

Besides, a second interlayer insulating film 66' is formed so that the wiring lines 76, 78, 80 and 82 are buried therein. The interlayer insulating film 66' over the tungsten plug 70 and the wiring line 78 is opened and a contact hole is formed. For example, a tungsten plug 75 is formed in the contact hole. A wiring line 83 extending horizontally in the drawing is formed on the tungsten plug 75. An interlayer insulating film 66" is formed so that the wiring line 83 is buried therein.

In this structure, although the n⁻ well 6 is formed in the p-type silicon semiconductor substrate 2, it is a matter of course that a p⁻ well may be formed in an n-type silicon semiconductor substrate. In this case, in FIG. 1, an anode region is formed on the cathode region 62 side, and a cathode region is formed on the anode region 64 side. Besides, in this p⁻ well structure, a p-type MOSFET is used for the cell selection transistor ST. Further, not only the memory cell region but also a peripheral circuit region exists in the semiconductor storage device 1, and a CMOS structure may be formed for the peripheral circuit.

In this embodiment, as a gate electrode material, although polysilicon is used for the gate electrode 24 of the cell selection transistor ST, and Pt is used for the gate electrode 28 of the pn junction diode GD with the ferroelectric gate, the formation material of the gate electrode is not limited to these.

For example, Ir, Ru, IrO$_2$, SRO (SrRuO$_3$) or RuO$_2$ may be used as the formation material of the gate electrodes 24 and 28.

As the ferroelectric film, Pb(Zr,Ti)O$_3$ having a perovskite structure, PZT material in which a dopant such as La, Ca, Sr or Nb is added to Pb(Zr,Ti)O$_3$, (Bi,La)$_4$Ti$_3$O$_{12}$ having a bismuth layer structure, SrBi$_2$Ta$_2$O$_9$ or the like is used. In the ferroelectric having the bismuth layer structure, as compared with the PZT material, although the quantity of polarization charge is small, the dielectric constant is also small. The FET-type FeRAM operates satisfactorily when the quantity of polarization charge is about 1 μC/cm$^2$. The ferroelectric having the bismuth layer structure has a small dielectric constant, and a higher voltage can be applied to the ferroelectric layer. Although the SBT is used as the formation material of the ferroelectric film 26 for data storage, it is a matter of course that a ferroelectric material such as, for example, BLT ((Bi,La)$_4$Ti$_3$O$_{12}$), PGO(Pb$_5$Ge$_3$O$_{11}$), BFO(BiFeO$_3$), STN (Sr$_2$(Ta, Nb)$_2$O$_7$) or BNMO(BiNi$_x$Mn$_{1-x}$O$_3$) or the like may be used.

Figures 2, 3:
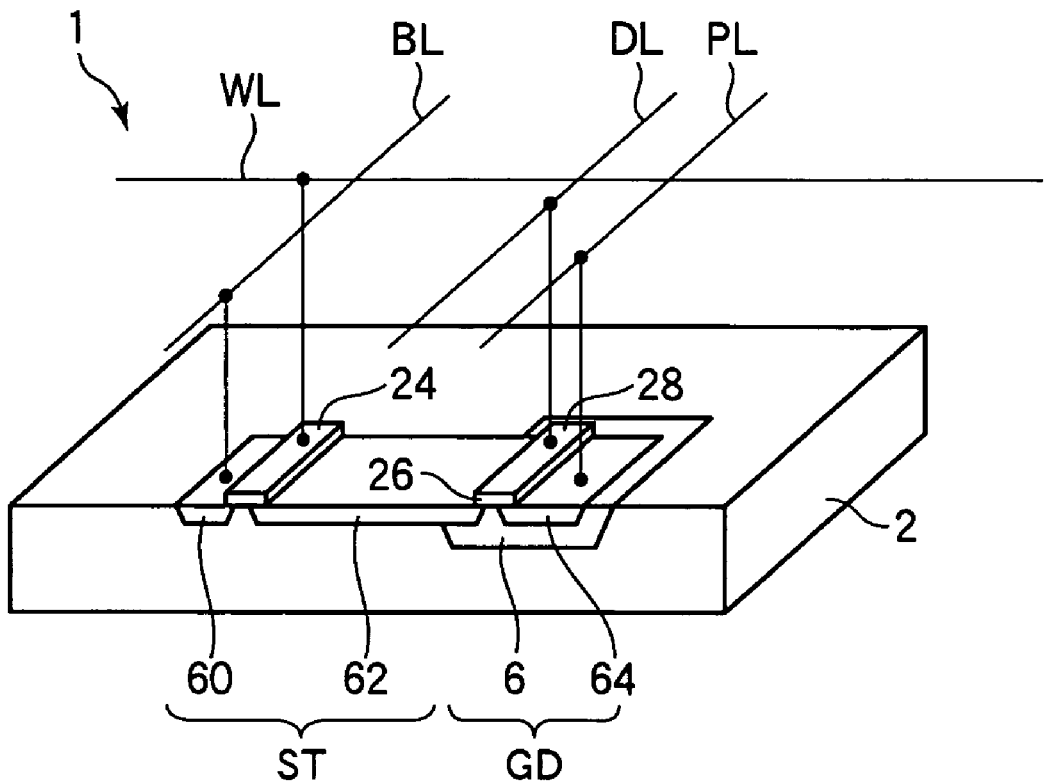
FIG. 2 is a perspective view schematically showing a structure of a memory cell of the semiconductor storage device 1 according to the first embodiment of the invention.
FIG. 3 is a table showing applied voltages to respective lines WL, BL, DL and PL at the time of data writing of the semiconductor storage device 1 according to the first embodiment of the invention.

Next, the pn junction diode GD with the ferroelectric gate of this embodiment and a data writing/reading method by the semiconductor storage device 1 using the same will be described with reference to FIG. 2 to FIG. 8C. FIG. 2 is a perspective view schematically showing a structure of a memory cell of the semiconductor storage device 1 according to this embodiment. As shown in FIG. 2, a bit line BL extending in an oblique direction in the drawing and outputting data to the drain region 60 is electrically connected to the drain region 60 of the cell selection transistor ST. A word line WL intersecting with the bit line BL and outputting a cell selection signal to control the on/off of the cell selection transistor ST to the gate electrode 24 is electrically connected to the gate electrode 24 of the cell selection transistor ST.

A drive line DL to apply a voltage for inverting the polarization direction of the data storage ferroelectric film 26 to the gate electrode 28 is electrically connected to the gate electrode 28 of the pn junction diode GD with the ferroelectric gate in almost parallel to the bit line BL. A plate line PL to cause the anode region 64 to become open or to have a reference potential (for example, GND (earth)) is electrically connected to the anode region 64 of the pn junction diode GD with the ferroelectric gate in almost parallel to the bit line BL and the drive line DL. The semiconductor storage device 1 writes data into the memory cell or reads data stored in the memory cell by the combination of voltages applied to the word line WL, the bit line BL, the drive line DL and the plate line PL.

FIG. 3 is a table showing applied voltages to the respective lines WL, BL, DL and PL at the time of data writing. As shown in FIG. 3, at the time of writing of 1-bit data of "0" indicated at the leftmost column, the word line WL is made +V0 (V), the bit line BL is made 0 (V), the drive line DL is made +V1 (V), and the plate line PL is made open (high impedance state). Besides, at the time of writing of 1-bit data of "1" indicated in the leftmost column, the word line WL is made +V0 (V), the bit line BL is made +V1 (V), the drive line DL is made 0 (V), and the plate line PL is made open. Here, +V1 (V) indicates the data voltage corresponding to 1-bit data of "1".

Figure 4A:
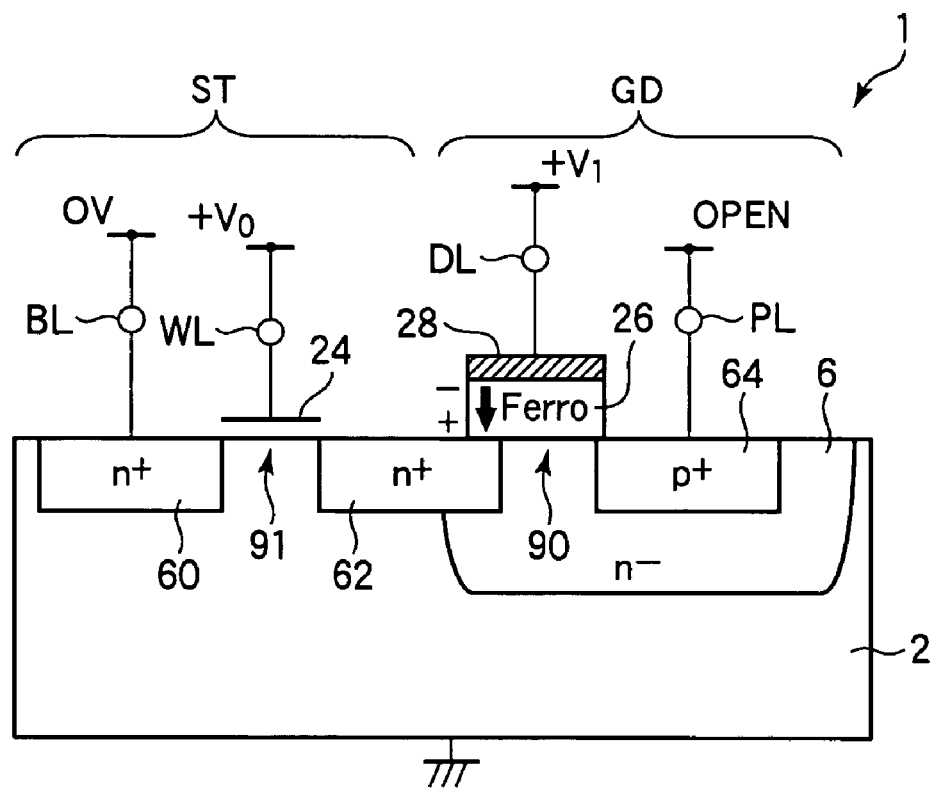
FIGS. 4A and 4B are views for explaining a method of writing 1-bit data of "0" into the memory cell of the semiconductor storage device 1 according to the first embodiment of the invention.
Figure 4B:
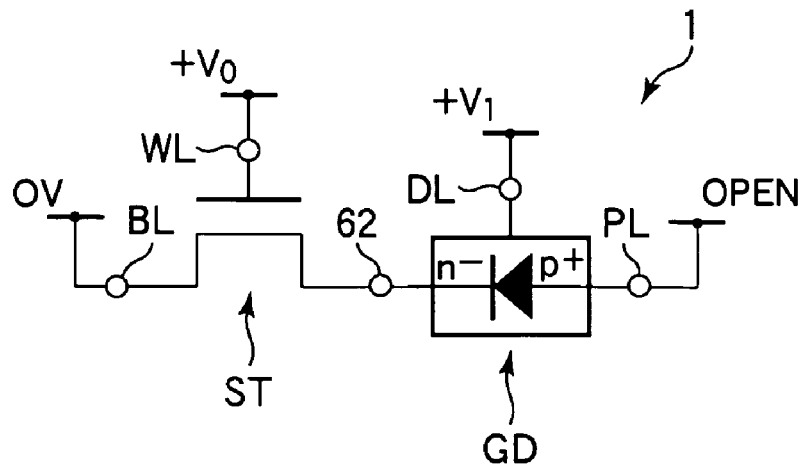

Next, the data writing into the memory cell of the semiconductor storage device 1 of this embodiment will be described more specifically with reference to FIG. 4A to FIG. 5B. FIG. 4A and FIG. 4B are views for explaining the method of writing 1-bit data corresponding to "0" into the memory cell of the semiconductor storage device 1. FIG. 4A schematically shows the memory cell of the semiconductor storage device 1 at the time of writing of the 1-bit data corresponding to "0", and FIG. 4B shows an equivalent circuit of the memory cell at the time of writing of the 1-bit data corresponding to "0".

As shown in FIG. 4A and FIG. 4B, when the gate voltage of +V0 (V) is applied as the cell selection signal from the word line WL to the gate electrode 24 of the cell selection transistor ST, the channel is formed in the channel region 91 and the cell selection transistor ST is put in the on state, and the data voltage of 0 (V) corresponding to the 1-bit data of "0" applied to the drain region 60 from the bit line BL is applied to the cathode region 62 and the n$^-$ well 6. By this, the data voltage of 0(V) is applied to the whole surface of the inversion layer formation region 90 below the ferroelectric film 26. Since the plate line PL is in the open state, current does not flow between the anode region 64 and the n$^-$ well 6, and the voltage of the n$^-$ well 6 is kept at 0 (V).

For example, at the same time as the input of the cell selection signal, the voltage of +V1 (V) is applied to the gate electrode 28 of the pn junction diode GD with the ferroelectric gate from the drive line DL. Since the potential 0 of the data voltage is lower than the potential +V1 of the gate electrode 28, the voltage applied to the ferroelectric film 26 has such a polarity that the gate electrode 28 side becomes positive (+) and the semiconductor substrate 2 side becomes negative (−). By this, the ferroelectric film 26 is polarized downward as indicated by a thick arrow of FIG. 4A. Since the surface of the ferroelectric film 26 on the semiconductor substrate 2 side is charged positively (+), electrons are collected in the inversion layer formation region 90, and the inversion layer is not formed. As shown in FIG. 4A, in this embodiment, the state where the polarization direction of the ferroelectric film 26 is downward, that is, the direction is directed to the semiconductor substrate 2 side is made to correspond to the 1-bit data of "0". Besides, as shown in FIG. 4B, the pn junction diode GD with the ferroelectric gate in which 1-bit data corresponding to "0" is written becomes the p$^+$n$^-$ junction diode.

After the end of the data writing, even if the respective lines WL, BL and DL are put in a non-applied state, since the polarization direction of the ferroelectric film 26 is kept, the memory cell can store the 1-bit data corresponding to "0".

Figure 5A:
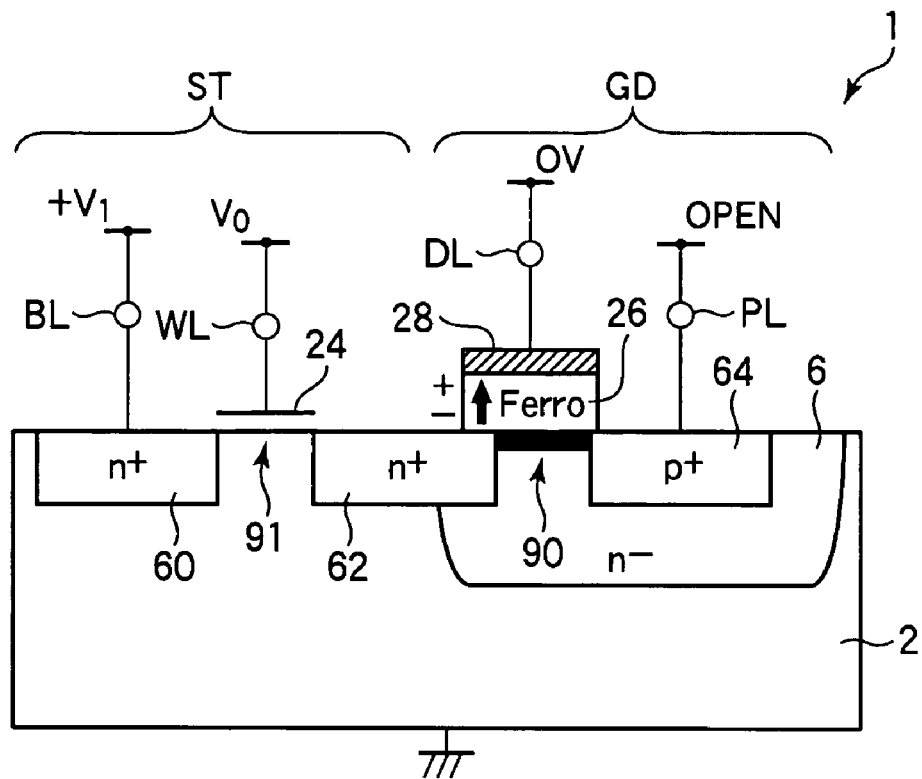
FIGS. 5A and 5B are views for explaining a method of writing 1-bit data of "1" into the memory cell of the semiconductor storage device 1 according to the first embodiment of the invention.
Figure 5B:
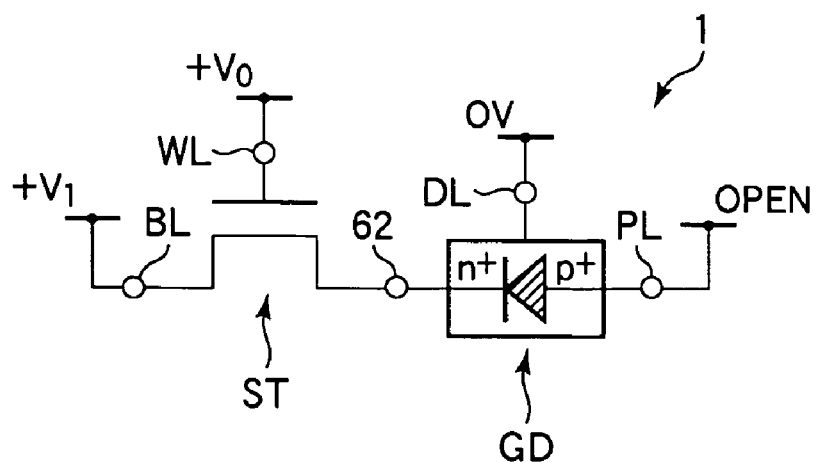

FIG. 5A and FIG. 5B are views for explaining the method of writing 1-bit data of "1" into the memory cell of the semiconductor storage device 1. FIG. 5A schematically shows the memory cell of the semiconductor storage device 1 at the time of writing of the 1-bit data corresponding to "1", and FIG. 5B shows an equivalent circuit of the memory cell at the time of writing of the 1-bit data corresponding to "1".

As shown in FIG. 5A and FIG. 5B, when the gate voltage of +V0 (V) is applied as the cell selection signal from the word line WL to the gate electrode 24 of the cell selection transistor ST, the channel is formed in the channel region 91, the cell selection transistor ST is put in the on state, and the data voltage of +V1 (V) corresponding to the 1-bit data of "1" applied to the drain region 60 from the bit line BL is applied to the cathode region 62 and the n$^-$ well 6. By this, the data voltage of +V1 (V) is applied to the whole surface of the inversion layer formation region 90 below the ferroelectric film 26. Since the plate line PL is in the open state, a current does not flow between the anode region 64 and the n$^-$ well 6, and the voltage of the n$^-$ well 6 is kept at +V (V).

For example, at the same time as the input of the cell selection signal, the voltage of 0 (V) is applied to the gate electrode 28 of the pn junction diode GD with the ferroelectric gate from the drive line DL. Since the potential +V1 of the data voltage is higher than the potential 0 of the gate electrode 28, the voltage applied to the ferroelectric film 26 has such a polarity that the gate electrode 28 side becomes negative (−) and the semiconductor substrate 2 side becomes positive (+). By this, the ferroelectric film 26 is polarized upward as indicated by a thick arrow of FIG. 5A. Since the surface of the ferroelectric film 26 on the semiconductor substrate 2 side is charged negatively (−), positive holes are collected in the inversion layer formation region 90 and the p$^+$-type inversion layer is formed. As shown in FIG. 5A, in the invention, the state where the polarization direction of the ferroelectric film 26 is upward, that is, the direction is directed to the gate electrode 28 side is made to correspond to the 1-bit data of "1". Besides, as shown in FIG. 5B, the pn junction diode GD with the ferroelectric gate in which the 1-bit data of "1" is written becomes a p$^+$n$^+$ junction diode.

Next, the reading of data stored in the memory cell of the semiconductor storage device 1 of this embodiment will be described with reference to FIG. 6 to FIG. 8C. FIG. 6 is a table showing applied voltages to the respective lines WL, BL, DL and PL at the time of data reading. As shown in FIG. 6, when 1-bit data of "0" or "1" indicated in the leftmost column is read, the word line WL is made +V0 (V), the bit line BL is made +Vr (V), the drive line DL is made 0 (V), and the plate line PL is made the reference potential (for example, GND (earth)). Here, +Vr (V) is the data reading voltage for data reading, and is set to satisfy the relation of +V0 >+Vr>0. Although described later in detail, as shown in the rightmost column of FIG. 6, at the time of reading of 1-bit data of "0", a reverse current Id flowing through the pn junction diode GD with the ferroelectric gate becomes very small current I0 (mA) which can be regarded as 0, and at the time of reading of 1-bit data of "1", a reverse current Id becomes very large current I1 (mA) as compared with I0.

Figure 7A:
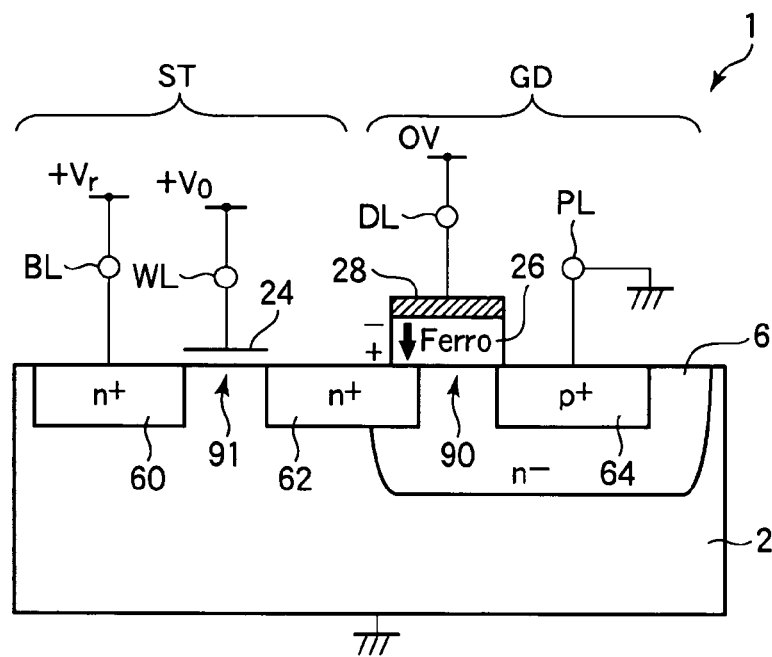
FIGS. 7A to 7C are views for explaining a method of reading 1-bit data of "0" from the memory cell of the semiconductor storage device 1 according to the first embodiment of the invention.
Figure 7B:
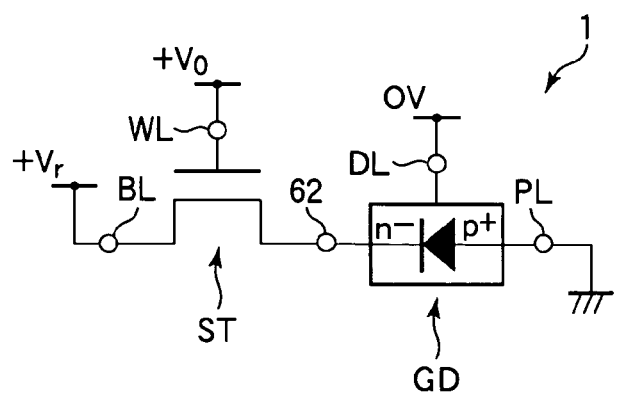
Figure 7C:
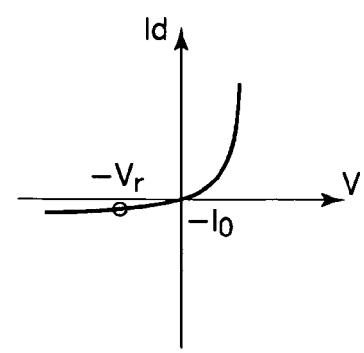

Next, the data reading from the memory cell of the semiconductor storage device 1 of this embodiment will be described more specifically with reference to FIG. 7A to FIG. 8C. FIGS. 7A to 7C are views for explaining a method of reading 1-bit data corresponding to "0" from the memory cell of the semiconductor storage device 1. FIG. 7A schematically shows the memory cell of the semiconductor storage device 1 at the time of reading of the 1-bit data corresponding to "0", FIG. 7B shows an equivalent circuit of the memory cell at the time of reading of the 1-bit data corresponding to "0", and FIG. 7C shows a characteristic (IV characteristic) of current Id–voltage V of the pn junction diode GD with the ferroelectric gate.

As shown in FIGS. 7A and 7B, when the gate voltage of +V0 (V) is applied as the cell selection signal from the word line WL to the gate electrode 24 of the cell selection transistor ST, the channel is formed in the channel region 91, the cell selection transistor ST is put in the on state, and the data reading voltage +Vr (V) applied to the drain region 60 from the bit line BL is applied to the cathode region 62 and the n$^-$ well 6. Since the plate line PL is grounded, a reverse bias voltage is applied to the pn junction diode GD with the ferroelectric gate.

For example, at the same time as the input of the cell selection signal, the voltage of 0 (V) is applied from the drive line DL to the gate electrode 28 of the pn junction diode GD with the ferroelectric gate. By this, a predetermined voltage is applied to the ferroelectric film 26. At this time, it is necessary that the reading voltage +Vr (V) is sufficiently small so that an influence is not given to the polarization direction.

As described above, at the time of storage of the 1-bit data corresponding to "0", since the inversion layer is not formed in the inversion layer formation region 90, the structure of the pn junction diode GD with the ferroelectric gate has (n$^+$)(n$^-$) (p$^+$). Accordingly, as shown in FIG. 7B, the pn junction diode GD with the ferroelectric gate can be regarded as the p$^+$n$^-$ junction diode in which the n$^-$ well 6 and the anode region 64 are connected. The breakdown voltage of the p$^+$n$^-$ junction diode is relatively large. Thus, when the magnitude of the data reading voltage +Vr is set to a value smaller than the breakdown voltage, as shown in FIG. 7C, even if a reverse bias voltage−Vr is applied, only a very small reverse current I0 (mA) which can be regarded as almost 0 flows through the pn junction diode GD with the ferroelectric gate.

Figure 8A:
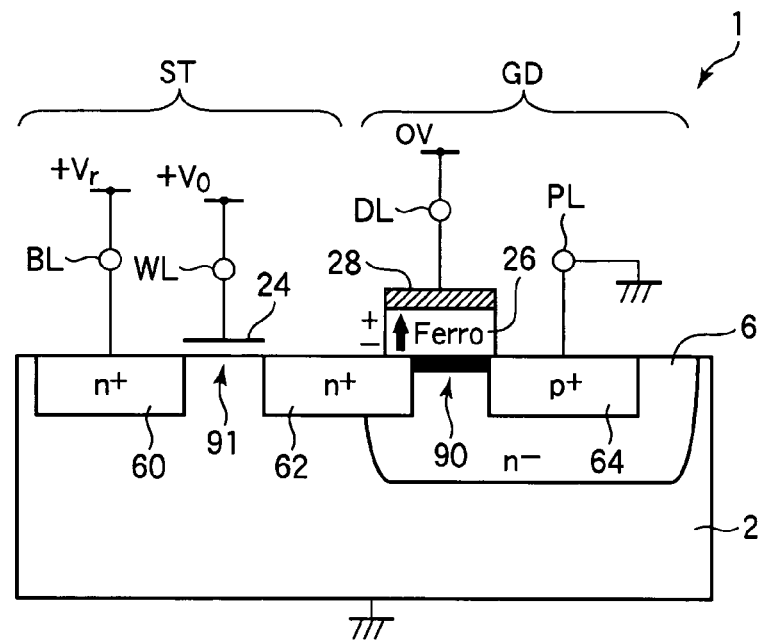
FIGS. 8A to 8C are views for specifically explaining the method of reading the 1-bit data of "1" from the memory cell of the semiconductor storage device 1 according to the first embodiment of the invention.
Figure 8B:
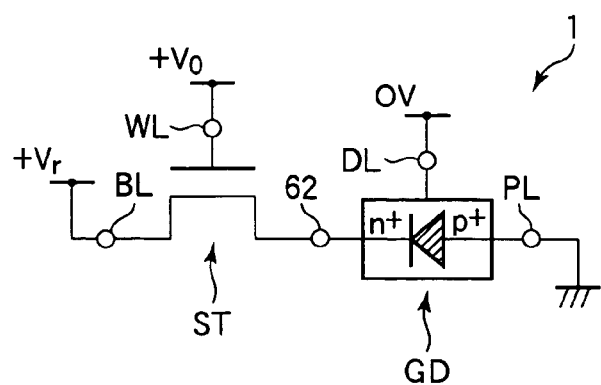
Figure 8C:
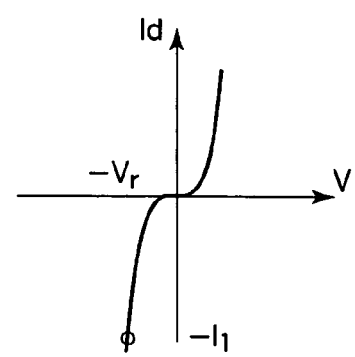

FIGS. 8A to 8C are views for more specifically explaining a method of reading the 1-bit data corresponding to "1" from the memory cell of the semiconductor storage device 1. FIG. 8A schematically shows the memory cell of the semiconductor storage device 1 at the time of reading of the 1-bit data corresponding to "1", FIG. 8B shows an equivalent circuit of the memory cell at the time of reading of the 1-bit data corresponding to "1", and FIG. 8C shows a characteristic (IV characteristic) of a current Id–voltage V of the pn junction diode GD with the ferroelectric gate.

As described by use of FIG. 6, voltages applied to the respective lines WL, BL, DL and PL at the time of reading of the 1-bit data corresponding to "1" are similar to voltages at the time of reading of the 1-bit data corresponding to "0". Accordingly, as shown in FIGS. 8A and 8B, the reverse bias voltage−Vr is applied to the pn junction diode GD with the ferroelectric gate.

As described above, at the time of storage of the 1-bit data corresponding to "1", since a p$^+$-type inversion layer is formed in the inversion layer formation region 90, as shown in FIG. 8B, the pn junction diode GD with the ferroelectric gate has (n$^+$)(p$^+$), and can be regarded as the p$^+$n$^+$ junction diode in which the cathode region 62 (n$^+$) and the anode region 64 (p$^+$) are connected through the p-type inversion layer. The withstand voltage between the cathode region 62 including the high concentration n-type impurity diffusion layer and the p$^+$-type inversion layer is lower than the withstand voltage between the anode region 64 including the high concentration p-type impurity diffusion layer and the n$^-$ well 6 including the inversion layer formation region 90 therein. Accordingly, the breakdown voltage in the state where the 1-bit data of "1" is stored and the pn junction is formed of the cathode region 62 and the p$^+$-inversion layer becomes smaller than that in the state where the 1-bit data of "0" is stored and the pn junction is formed of the anode region 64 and the n$^-$ well 6. Thus, as shown in FIG. 8C, when the reverse bias voltage −Vr (V) is applied, a very large reverse current I1 (mA) as compared with the reverse current I0 flows through the pn junction diode GD with the ferroelectric gate.

As stated above, since the magnitude of the reverse current flowing through the pn junction diode GD with the ferroelectric gate varies according to the data stored in the ferroelectric film 26, the 1-bit data corresponding to "0" or "1" can be read by determining the magnitude of the reverse current.

After the end of the data reading, even if the respective lines WL, BL, DL and PL are put in non-applied states, since the polarization direction of the ferroelectric film 26 for data storage is not changed, the memory cell can continue to store the 1-bit data corresponding to "0" or "1". Accordingly, the semiconductor storage device 1 of this embodiment can be read nondestructively.

When the impurity concentrations of the respective layers are controlled so that the impurity concentration of the n$^-$ well 6 (n$^-$ region) is smaller than the impurity concentration of the cathode region 62 (n$^+$ region), and the impurity concentration of the p-type silicon semiconductor substrate (p$^-$ region) is smaller than the impurity concentration of the anode region (p+ region), it is possible to realize the pn junction diode GD with the ferroelectric gate in which the ratio of the on current to the off current becomes 10 or more. At that time, on the assumption that the above conditions of the impurity concentrations of the respective regions are satisfied, it is desirable that the impurity concentration range of the n region is made $1.0\times10^{14}$ to $1.0\times10^{18}$ cm$^{-3}$, the impurity concentration range of the n$^+$ region is made $1.0\times10^{16}$ to $1.0\times10^{20}$ cm$^{-3}$, the impurity concentration range of the p$^-$ region is made $1.0\times10^{14}$ to $1.0\times10^{18}$ cm$^{-3}$, and the impurity concentration range of the p$^+$ region is made $1.0\times10^{16}$ to $1.0\times10^{20}$ cm$^{-3}$.

As described above, according to this embodiment, data is written according to the polarization direction of the ferroelectric film 26 for data storage provided in the pn junction diode GD with the ferroelectric gate, and data can be read according to the magnitude of the current flowing through the pn junction diode GD with the ferroelectric gate. Since the semiconductor storage device 1 of this embodiment has not such structure that data is read based on the quantity of charge stored in the ferroelectric capacitor like the conventional 1T1C-type FeRAM, it is excellent in scaling capability and integration. Besides, in the semiconductor storage device 1 of this embodiment, since a large voltage is not applied to the ferroelectric film 26 of a non-selected cell at the time of data reading, as compared with the conventional FET-type 1T FeRAM, the disturb characteristics can be improved, and reduction in power consumption of the semiconductor storage device can be realized.

Next, a manufacturing method of the pn junction diode GD with the ferroelectric gate and the semiconductor storage device 1 using the same according to this embodiment will be described with reference to FIG. 9A to FIG. 13. FIG. 9A to FIG. 13 are process sectional views showing the manufacturing method of the pn junction diode GD with the ferroelectric gate and the semiconductor storage device 1 using the same according to this embodiment.

Figure 9A:
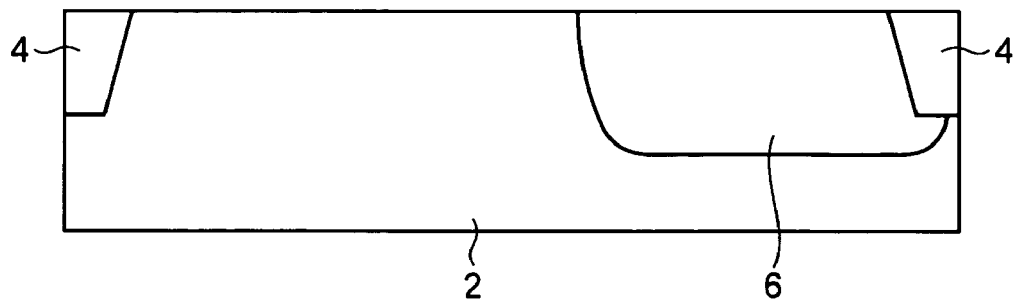
FIGS. 9A to 9C are process sectional views (No. 1) showing a manufacturing method of the pn junction diode GD with the ferroelectric gate and the semiconductor storage device 1 using the same according to the first embodiment of the invention.

First, as shown in FIG. 9A, an element isolation insulating film 4 is formed on a p-type silicon semiconductor substrate 2 by using an STI (Shallow Trench Isolation) method or a LOCOS (Local Oxidation of Silicon) method.

Next, a resist layer (not shown) is formed which is patterned so as to cover a region in an element region defined by the element isolation insulating film 4 other than an n$^-$ well formation region. Subsequently, the resist layer is used as a mask, and an n-type impurity is ion implanted into the substrate 2 to a depth of about 1 μm. Next, after the resist layer is removed, an annealing treatment is performed to activate the impurity and an n$^-$ well 6 is formed.

Figure 9B:
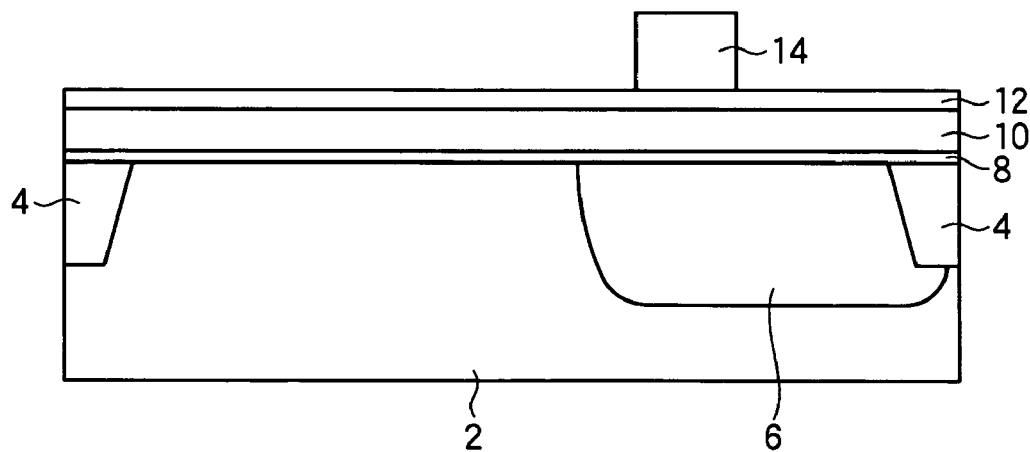

Next, as shown in FIG. 9B, an HfO$_2$ film 8 with a thickness of 4 nm, which becomes a gate insulating film, is formed on the whole surface of the semiconductor substrate 2 by using, for example, a CVD method, and next, an SBT (SrBi$_2$Ta$_2$O$_9$) film 10 with a thickness of 400 nm, which becomes a ferroelectric film, is formed on the HfO$_2$ film 8 by using a CSD method (sol-gel method).

Next, the substrate 2 is subjected to an annealing treatment in an atmosphere of oxygen (O$_2$) 100% at 800° C. to 900° C. Next, a Pt film 12 with a thickness of 100 nm, which becomes a gate electrode of a pn junction diode with a ferroelectric gate, is formed on the SBT film 10 by an electron beam evaporation method.

Incidentally, although the HfO$_2$ (hafnium oxide) film 8 as material of a gate insulating film is used in order to form the ferroelectric film, as a gate insulating film of a gate portion ST-G of a cell selection transistor ST without a ferroelectric film, although a manufacture process is increased, a silicon oxide film (not shown) formed on the semiconductor substrate 2 by using a thermal oxidation method may be used. Next, a resist is applied, patterning is performed, and a resist layer 14 is formed in a gate region of the pn junction diode with the ferroelectric gate.

Figure 9C:
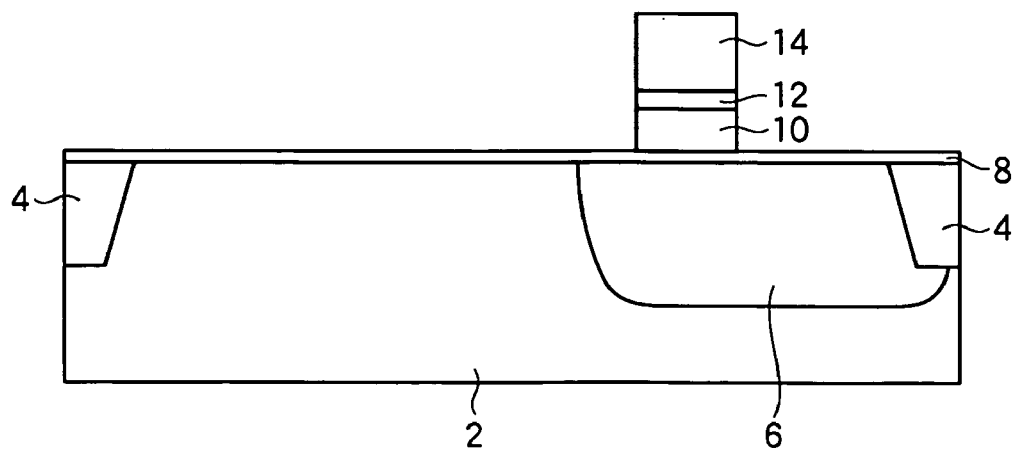

Next, a chlorine-based etching gas is used to etch the semiconductor substrate 2 while the resist layer 14 is used as an etching mask, and as shown in FIG. 9C, the Pt film 12 and the SBT film 10 of the exposed part are successively removed, and the etching processing is performed until the HfO$_2$ film 8 is exposed. Finally, the resist layer 14 used as the etching mask is removed.

Figure 10A:
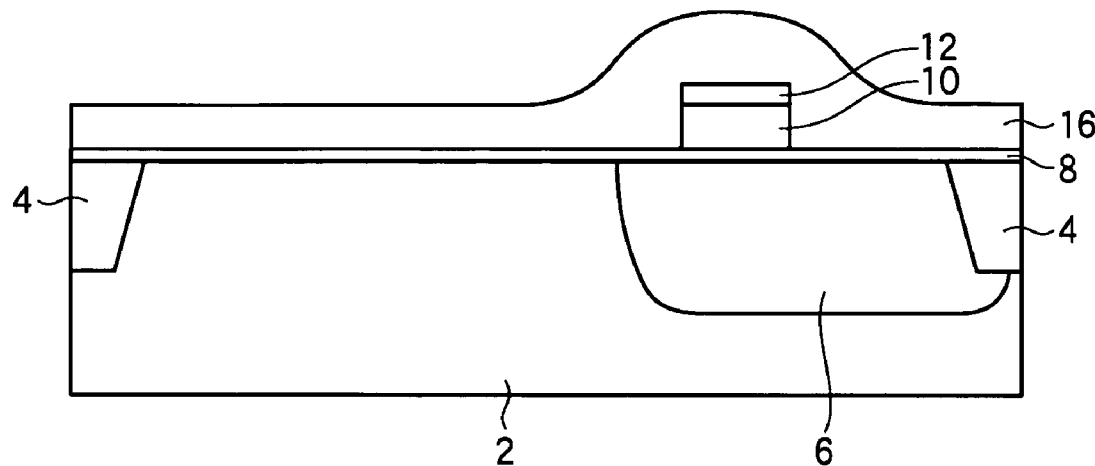
FIGS. 10A and 10B are process sectional views (No. 2) showing the manufacturing method of the pn junction diode GD with the ferroelectric gate and the semiconductor storage device 1 using the same according to the first embodiment of the invention.
Figure 10B:
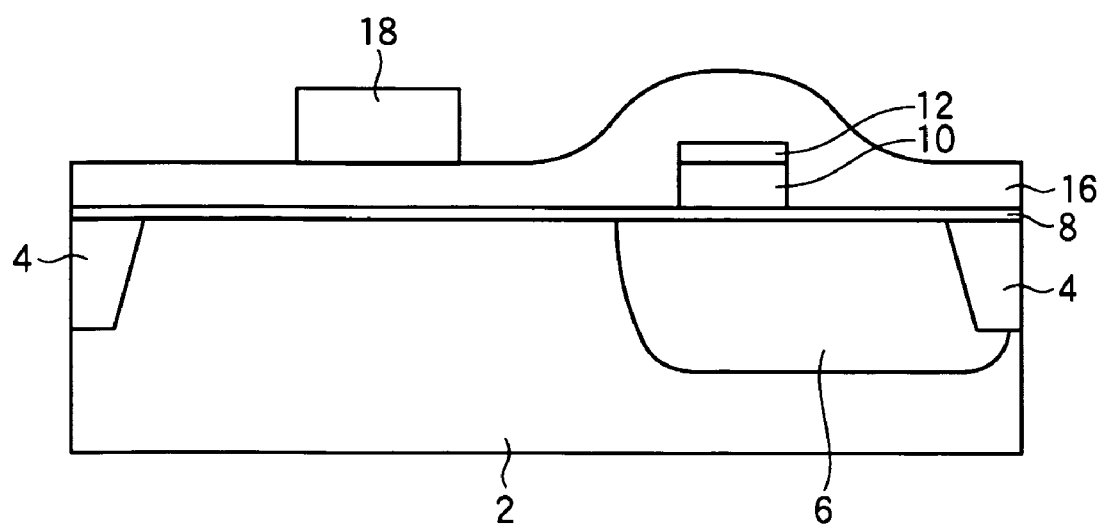

Next, as shown in FIG. 10A, for example, a CVD method is used to form a polycrystalline silicon (polysilicon) film 16 with a thickness of 250 nm on the whole surface. As the need arises, the polysilicon surface is flattened by a method such as a CMP method, and then, as shown in FIG. 10B, a resist layer 18 is applied, the resist layer 18 is made to remain only in a portion where the polysilicon is made to remain, and the other is etching-removed.

Figure 11A:
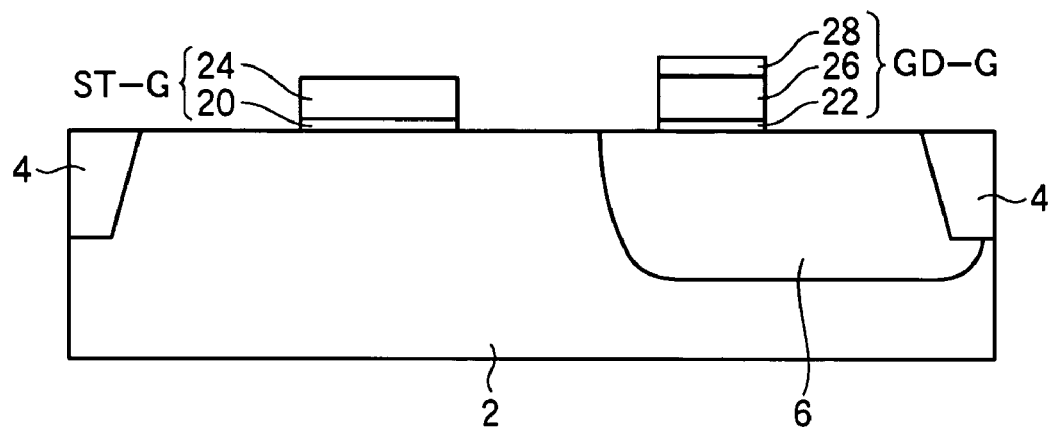
FIGS. 11A and 11B are process sectional views (No. 3) showing the manufacturing method of the pn junction diode GD with the ferroelectric gate and the semiconductor storage device 1 using the same according to the first embodiment of the invention.

Next, after the resist layer 18 is removed, the HfO$_2$ film is etching-removed. By this, as shown in FIG. 11A, a gate portion GD-G of the pn junction diode GD with the ferroelectric gate, which includes a gate insulating film 22 of the HfO$_2$ film, a ferroelectric film 26 of the SBT film formed on the gate insulating film 22, and a gate electrode 28 of the Pt film formed on the ferroelectric film 26, is completed. Similarly, a gate portion ST-G of a cell selection transistor ST, which includes a gate insulating film 20 of the HfO$_2$ film, and a gate electrode 24 of the polysilicon film formed on the gate insulating film 20, is completed.

Figure 11B:
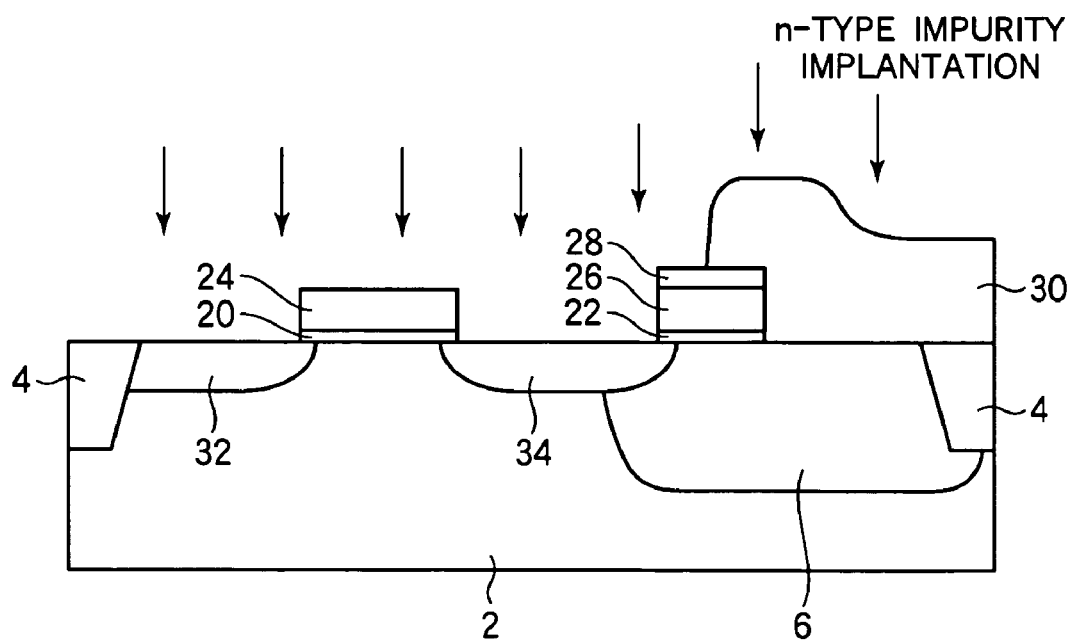

Next, as shown in FIG. 11B, a resist is applied to perform patterning, and a resist layer 30 covering the p-type impurity formation region to be formed in the n$^-$ well 6 is formed. Subsequently, for example, an ion implantation method is used to introduce an n-type impurity, such as P (phosphorous) or As (arsenic), into a region in the semiconductor substrate 2 while the resist layer 30 and the gate parts ST-G and GD-G are used as masks, and n-type impurity regions 32 and 34 are formed. For example, the implantation condition of P is such that an acceleration energy is 30 keV to 70 keV, and a dosage is $2\times10^{15}$ cm$^{-2}$ to $1\times10^{16}$ cm$^{-2}$, and preferably, an acceleration energy is 50 keV, and a dosage is $8\times10^{15}$ cm$^{-2}$, and the ion implantation is performed. Thereafter, the resist layer 30 is removed.

Figure 12:
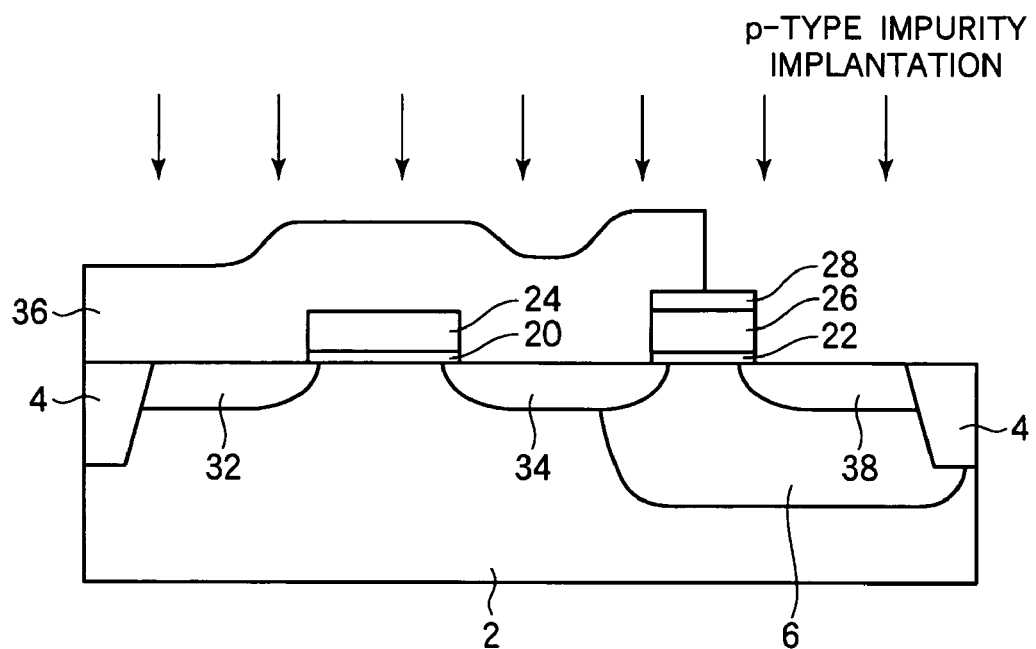
FIG. 12 is a process sectional view (No. 4) showing the manufacturing method of the pn junction diode GD with the ferroelectric gate and the semiconductor storage device 1 using the same according to the first embodiment of the invention.

Next, as shown in FIG. 12, a resist is applied to perform pattering, and a resist layer 36 is formed in which a part on a p-type impurity region 38 to be formed in the n$^-$ well 6 is exposed. Subsequently, for example, an ion implantation method is used to introduce a p-type impurity, such as B (boron), into the semiconductor substrate 2 while the resist layer 36 and the gate portion GD-G are used as masks. For example, the implantation condition of B is such that the acceleration energy is 20 keV to 60 keV, and the dosage is $2'310^{15}$ cm$^{-2}$ to $2\times10^{16}$ cm$^{-2}$, and preferably, the acceleration energy is 40 keV, and the dosage is $8\times10^{15}$ cm$^{-2}$, and the ion implantation is performed. Thereafter, the resist layer 36 is removed.

Next, an annealing treatment is performed using a rapid lamp heating apparatus or the like, and the implanted impurity is activated. This annealing treatment is performed at, for example, a heating temperature (attained temperature) of from 700° C. to 1000° C. and for a heating time of from 20 s to 120 s. By this, the impurity regions 32, 34 and 38 shown in FIG. 12 are activated, and as shown in FIG. 13, n-type impurity diffusion layers 60 and 62 on both sides of the gate portion ST-G and an anode region 64 made of a p-type impurity diffusion layer are formed.

Figure 13:
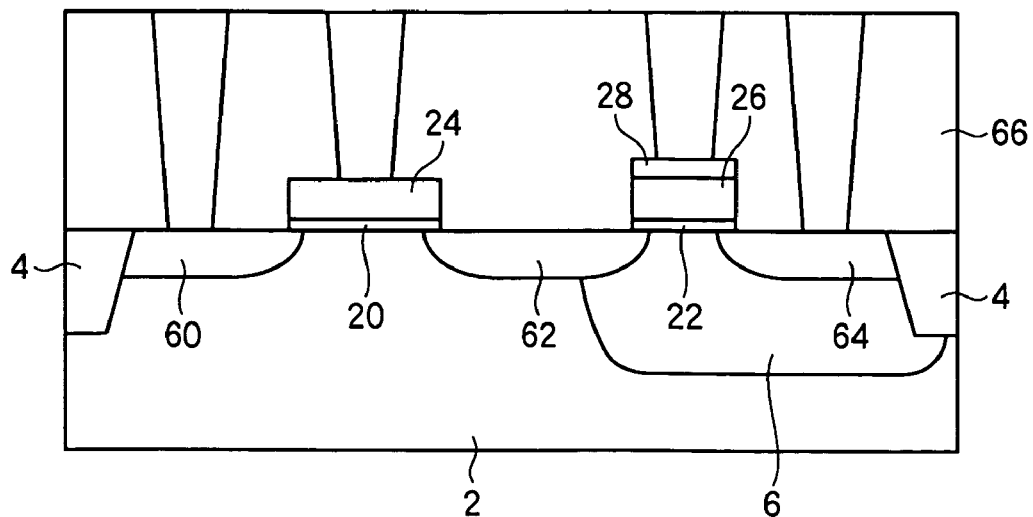
FIG. 13 is a process sectional view (No. 5) showing the manufacturing method of the pn junction diode GD with the ferroelectric gate and the semiconductor storage device 1 using the same according to the first embodiment of the invention.

Thereafter, as shown in FIG. 13, an interlayer insulating film 66 of silicon dioxide ($SiO_2$) is grown on a cover film to a thickness of about 1.0 µm by a plasma CVD method using a TEOS gas. Subsequently, the interlayer insulating film 66 is polished by a chemical mechanical polishing (CMP) method, and its surface is flattened. Next, as shown in FIG. 13, contact holes are formed. Next, a Ti film and a Pt film are successively formed on the interlayer insulating film 66 by a DC sputtering method. In this case, the thickness of the Ti film is made about 10 to 30 nm, for example, 20 nm, and the thickness of the Pt film is made about 100 to 300 nm, for example, 175 nm. The Ti film has a role to improve the adhesion between the Pt film and the interlayer insulating film 66.

Incidentally, during this, as a protection layer (not shown), an oxide film of $Al_2O_3$, $ZrO_2$, $HfO_2$ or the like may be formed to have a thickness of 50 nm by a sputtering method. The protection layer is formed in order to protect the dielectric film, which is easily reduced, against hydrogen and to prevent hydrogen from entering the inside.

Next, as shown in FIG. 1, tungsten plugs 68, 70, 72 and 74 are formed. After the resist layer is removed, RF pre-treatment etching is performed on the interlayer insulating film 66 and on the inside of the contact hole, and then, a Ti film with a thickness of 20 nm and a TiN (titanium nitride) film with a thickness of 50 nm are formed thereon by a sputtering method, and these films are made a contact layer. Further, a tungsten film is formed on the contact layer by a CVD method using a mixture gas of tungsten fluoride gas ($WF_6$), argon, and hydrogen.

Incidentally, a silane ($SiH_4$) gas is also used at the beginning of the growth of the tungsten film. The tungsten film is made to have such a thickness that the contact holes are completely buried, for example, about 500 nm on the interlayer insulating film. Incidentally, since each of the contact holes is taper-shaped, a cavity (also called a blowhole or void) is hardly formed in the tungsten film embedded therein.

Next, the tungsten film and the contact layer on the interlayer insulating film 66 are removed by a CMP method, and are made to remain only in the respective contact holes. By this, the tungsten film and the contact layer in the contact hole are used as tungsten plugs 68, 70, 72 and 74. Here, when etchback is used instead of the CMP method, since different etching gases are required in the etching of the tungsten film and the etching of the contact layer, etching control requires much time.

Thereafter, wiring lines 76, 78, 80 and 82 are formed by using Al or Cu in the horizontal direction. As the need arises, a second interlayer insulating film and contact holes are provided, and tungsten is embedded to form wiring layers in the vertical direction (nothing is shown). This wiring process is repeated plural times according to the circuit structure. Through the above process, the semiconductor storage device 1 having the structure as shown in FIG. 1 and according to this embodiment is completed.

Figure 14:
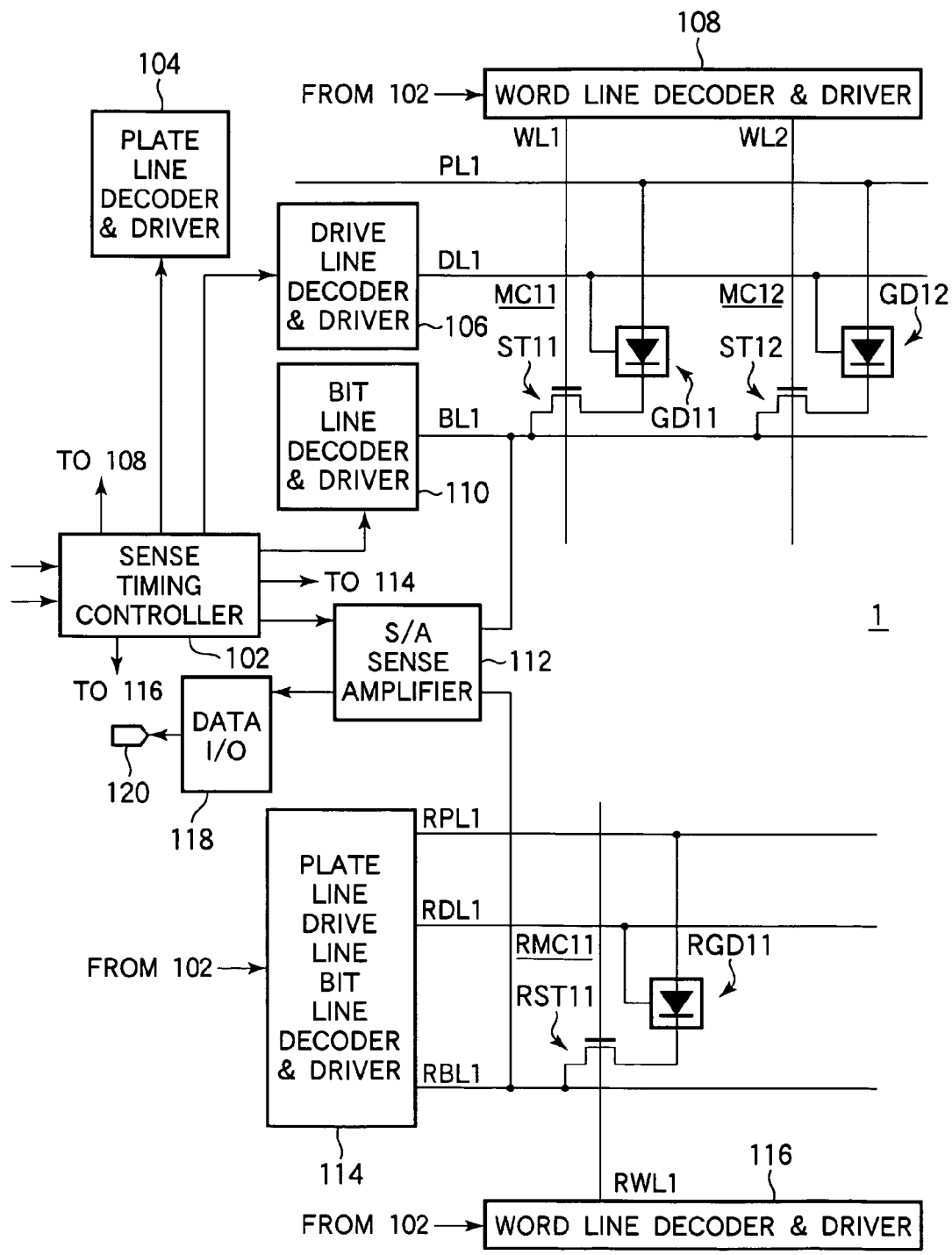
FIG. 14 is a view showing an equivalent circuit of a memory array structure of the semiconductor storage device 1 according to the first embodiment of the invention.

Next, a memory array structure of the semiconductor storage device of this embodiment will be described using its equivalent circuit. FIG. 14 shows an equivalent circuit of the memory array structure of the semiconductor storage device 1 of this embodiment. FIG. 14 shows a circuit example of 1×2 memory cells of the semiconductor storage device 1 having a memory cell array of m rows by n columns. Plural memory cell regions MC11 and MC12 are arranged in a matrix form, and plural word lines WL1 and WL2 and plural bit lines BL1 (FIG. 14 shows one line) are arranged horizontally and vertically. Further, plural drive lines DL1 and plural plate lines PL1 (FIG. 14 shows one line for each of both) are arranged in parallel to the bit line BL1. In the respective memory cell regions MC11 and MC12, pn junction diodes GD11 and GD12 with ferroelectric gates shown in FIG. 1 and cell selection transistors ST11 and ST12 respectively connected to the diodes GD11 and GD12 are formed.

Hereinafter, although the circuit structure of the semiconductor storage device 1 will be described while the memory cell region MC11 is used as an example, the other memory cell regions MCmn also have the same structure as the memory cell region MC11. A gate terminal of the cell selection transistor ST11 in the memory cell region MC11 is connected to the word line WL1 for applying a cell selection signal, a drain terminal is connected to the bit line BL1 for outputting data, and a source terminal is connected to a cathode terminal of the pn junction diode GD11 with the ferroelectric gate.

An anode terminal of the pn junction diode GD11 with the ferroelectric gate is connected to the plate line PL1 in which open/ground is switched at writing/reading of data, and a gate terminal is connected to the drive line DL1 for applying a voltage to invert the polarization direction of the ferroelectric film for data storage.

The wordline WL1 is connected to a word line decoder/driver circuit 108. The plate line PL1 is connected to a plate line decoder/driver circuit 104. The drive line DL1 is connected to a drive line decoder/driver circuit 106. The bit line BL1 is connected to a bit line decoder/driver circuit 110. The decoder/driver circuits 104, 106, 108 and 110 are controlled by a sense timing controller 102, and predetermined voltages necessary for writing/reading are applied to the respective lines PL1, DL1, WL1 and BL1 at predetermined timings.

The bit line BL1 is further connected with a sense amplifier (S/A) 112. The sense amplifier 112 determines "0" or "1" of the readout data read out from the memory cell region MC11.

The semiconductor storage device 1 includes a reference memory cell region RMC to output reference data used for the determination of "0" or "1" of the readout data read out from the memory cell region MC. The number of the reference memory cell regions RMC is, for example, equal to that of the memory cell regions MC. FIG. 14 shows a circuit example of 1 reference memory cell among a reference memory cell array of m rows by n columns. Plural reference memory cell regions RMC11 (FIG. 14 shows one region) are arranged in a matrix form, and plural reference word lines RWL1 and plural reference bit lines RBL1 (FIG. 14 shows one line for each of both) are arranged vertically and horizontally. Further, plural reference drive lines RDL1 and plural reference plate lines RPL1 (FIG. 14 shows one line for each of both) are arranged in parallel to the reference bit line RBL1. In each reference memory cell region RMC11, a pn junction diode RGD11 with a ferroelectric gate and a cell selection transistor RST11, which have the same structures as the pn junction diode GD 11 with the ferroelectric gate and the cell selection transistor ST11 provided in the memory cell region MC11, are formed.

Hereinafter, although a circuit structure will be described while the reference memory cell region RMC11 is used as an example, the other reference memory cell regions have the same structure as the reference memory cell region RMC11. A gate terminal of the cell selection transistor RST11 in the reference memory cell region RMC11 is connected to a reference word line RWL1 for applying a cell selection signal, a drain terminal is connected to a reference bit line RBL1 for outputting reference data, and a source terminal is connected to a cathode terminal of the pn junction diode RGD11 with the ferroelectric gate.

An anode terminal of the pn junction diode RGD11 with the ferroelectric gate is connected to a reference plate line RPL1 in which open/ground is switched at writing/reading of data, and a gate terminal is connected to a reference drive line RDL1 for applying a voltage to invert the polarization direction of the ferroelectric film for data storage.

The reference word line RWL1 is connected to a word line decoder/driver circuit 116. The reference plate line RPL1 is connected to a plate line decoder/driver circuit, the reference drive line RDL1 is connected to a drive line decoder/driver circuit, and the reference bit line RBL1 is connected to a bit line decoder/driver circuit. FIG. 14 shows these decoder/driver circuits as one decoder/driver circuit 114. The respective decoder/driver circuits 114 and 116 are controlled by the sense timing controller 102, and predetermined voltages necessary for writing/reading are applied to the respective lines RPL1, RDL1, RWL1 and RBL1 at predetermined timings.

The reference bit line RBL1 is further connected with the sense amplifier 112. The sense amplifier 112 compares a reverse current flowing through the memory cell region MC11 with a reverse current flowing through the reference memory region RMC11, performs current-voltage conversion, and amplifies the voltage level up to the logic level of an external system. The determination of "0" or "1" of the readout data read out from the memory cell region MC11 is performed according to the output voltage level of the sense amplifier 112. The sense amplifier 112 includes m sense amplifier circuits (not shown) with the bit line BLm and the reference bit line RBLm as the input.

The sense amplifier 112 is connected to a data I/O circuit 118. The data I/O circuit 118 is connected to an output part 120, and outputs the readout data to, for example, the external system.

Next, the operation of the memory array structure of the semiconductor storage device 1 according to this embodiment will be described with reference to FIG. 14 and FIG. 15. FIG. 15 is a table showing applied voltages to the respective lines WL, BL, DL and PL at the time of data writing/reading of the semiconductor storage device 1, and outputs of the sense amplifier in the case where 1-bit data corresponding to "0" has been written in the reference memory cell.

The applied voltages to the respective lines WL, BL and DL in the writing/reading at the time of cell selection and the switching of open/ground of the plate line PL are the same as those of FIG. 3 to FIG. 4B. As shown in FIG. 15, at the time of reading of 1-bit data corresponding to "0", the output of the sense amplifier shown in the rightmost column becomes a relatively low voltage +VL, and at the time of reading of 1-bit data corresponding to "1", the output of the sense amplifier becomes a relatively high voltage +VH. Although not shown in FIG. 15, in the case where 1-bit data corresponding to "1" has been written in the reference memory cell, the sense amplifier outputs a relatively high voltage +VH at the time of reading of 1-bit data corresponding to "0", and outputs a relatively low voltage +VL at the time of reading of 1-bit data corresponding to "1". The output of the sense amplifier is not applicable (N/A) at a time other than the time of data reading.

At the cell non-selected time, 0 (V) is applied to the word line WL, and the other lines BL, DL and PL are not applicable (N/A).

Next, the writing operation of the semiconductor storage device 1 will be described using a case where 1-bit data corresponding to "0" is written into the memory cell region MC11. By predetermined control signals outputted from the sense timing controller 102, the word line decoder/driver circuit 108 outputs the cell selection signal of the gate voltage of +V0 (V) to the word line WL1, the drive line decoder/driver circuit 106 outputs the voltage of +V1 (V) to the drive line DL1, and the plate line decoder/driver circuit 104 opens the plate line PL1. At the same time, 0 (V) is applied to the bit line BL1 by the bit line decoder/driver circuit 110. By this, the cell selection transistor ST11 and the pn junction diode GD11 with the ferroelectric gate provided in the memory cell region MC11 perform the writing operation similar to that described by use of FIG. 4A to FIG. 5B, and the 1-bit data corresponding to "0" is stored in the memory cell region MC11.

The memory cell region MCm1 other than the memory cell region MC11 in which the selection/non-selection is controlled by the word line WL1 is controlled so that when data is written into the memory cell region MC11, for example, the bit line BLm is put in a high impedance state and already stored data is not rewritten.

Next, the writing operation of the semiconductor storage device 1 will be described using a case where 1-bit data corresponding to "1" is written into the memory cell region MC12. By predetermined control signals outputted from the sense timing controller 102, the word line decoder/driver circuit 108 outputs the cell selection signal of the gate voltage of +V0 (V) to the word line WL2, the drive line decoder/driver circuit 106 outputs the voltage of 0 (V) to the drive line DL1, and the plate line decoder/driver circuit 104 opens the plate line PL1. At the same time, +V1 (V) is applied to the bit line by the bit line decoder/driver circuit 110. By this, the cell selection transistor ST12 and the pn junction diode GD12 with the ferroelectric gate provided in the memory cell region MC12 perform the same writing operation as that described by use of FIG. 4A to FIG. 5B, and the 1-bit data corresponding to "1" is stored into the memory cell region MC12.

In the selection period of the word line WL2, the voltage of 0 (V) is applied to the word line WLn other than the word line WL2, and the cell selection transistor STmn other than the cell selection transistor STm2 is in the off state. Accordingly, data is not written into the memory cell region MCmn other than the memory cell region MCm2, and the memory cell region MCmn continues to store the already stored data.

Next, the read operation of the semiconductor storage device 1 will be described while the operation of reading 1-bit data corresponding to "0" from the memory cell region MC11 is used as an example. By predetermined control signals outputted from the sense timing controller 102, the word line decoder/driver circuit 108 outputs the cell selection signal of the gate voltage of +V0 (V) to the word line WL1, the drive line decoder/driver circuit 106 applies the voltage of 0 (V) to the drive line DL1, and the plate line decoder/driver circuit 104 keeps the plate line PL1 at 0 (V). At the same time, the bit line decoder/driver circuit 110 outputs the data reading voltage +Vr(V) for data reading to the bit line BL1.

By this, a reverse bias voltage is applied to the pn junction diode GD11 with the ferroelectric gate in the memory cell region MC11. Since the 1-bit data corresponding to "0" has been stored in the memory cell region MC11, only a very small reverse current I0 (mA) which can be regarded as 0 (mA) flows through the pn junction diode GD11 with the ferroelectric gate.

Next, the reading operation of the semiconductor storage device 1 will be described while the operation of reading 1-bit data corresponding to "1" from the memory cell region MC12 is used as an example. By predetermined control signals outputted from the sense timing controller 102, the word line decoder/driver circuit 108 outputs the cell selection signal of gate voltage of +V0 (V) to the word line WL2, the drive line decoder/driver circuit 106 applies voltage of 0 (V) to the drive line DL1, and the plate line decoder/driver circuit 104 keeps the plate line PL1 at 0 (V). At the same time, the bit line decoder/driver circuit 110 outputs data reading voltage +Vr (V) for data reading to the bit line BL1.

By this, a reverse bias voltage is applied to the pn junction diode GD12 with the ferroelectric gate in the memory cell region MC12. Since the 1-bit data corresponding to "1" has been stored in the memory cell region MC12, a very large reverse current I1 (mA) as compared with the reverse current I0 flows through the pn junction diode GD12 with the ferroelectric gate.

For example, at the time of turning on the power of the semiconductor storage device 1 or at the same time as the time when data is written into the memory cell region MCmn, 1-bit data corresponding to "0" is stored into the reference memory cell region RMCmn. Since the data writing operation into the reference memory cell region RMCmn is the same as that of the memory cell region MCmn, its description will be omitted.

The sense timing controller 102 controls the cell selection transistor ST11, ST12 and the pn junction diode GD11, GD12 with the ferroelectric gate in the reference memory cell region RMC11, RMC12, so that at the same time as the reading of data from the memory cell region MC11 or the memory cell region MC12, 1-bit data corresponding to "0" is read out from the reference memory cell region RMC11 or the reference memory cell region RMC12. By predetermined control signals outputted from the sense timing controller 102, the word line decoder/driver circuit 116 outputs the cell selection signal of the gate voltage of +V0 (V) to the reference word line RWL1 or the reference word line RWL2. The decoder/driver circuit 114 applies the voltage of 0 (V) to the reference drive line RDL1 and causes the reference plate line RPL1 to become 0 (V). At the same time, the decoder/driver circuit 114 outputs the reference readout voltage +Vr (V) for reference data reading to the reference bit line RBL1.

By this, a reverse bias voltage is applied to the pn junction diode RGD11 with the ferroelectric gate in the reference memory cell region RMC11. Since the 1-bit data corresponding to "0" has been stored in the reference memory cell region RMC11, only a very small reverse current I0 (mA) which can be regarded as 0 (mA) flows through the pn junction diode GD11 with the ferroelectric gate. Besides, only a very small reverse current I0 (mA) which can be regarded as 0 (mA) flows through the reference memory cell region MC11 including the cell selection transistor ST11 controlled by the reference word line WL1.

The sense amplifier 112 compares the reverse current I0 flowing through the memory cell region MC11 with the reverse current I0 flowing through the reference memory cell region RMC11 by the sense amplifier circuit. Since the reverse currents flowing through the memory cell region MC11 and the reference memory cell region RMC11 have almost the same current values, a relatively low voltage of +VL (V) is outputted from the sense amplifier 112, and the readout data from the memory cell region MC11 is determined to be "0". On the other hand, the reverse current I1 flowing through the memory cell region MC12 and the reverse current I0 flowing through the reference memory cell region RMC12 (not shown) are greatly different from each other in the current value, a relatively high voltage of +VH (V) is outputted from the sense amplifier 112. By this, the readout data from the memory cell region MC12 is determined to be "1".

The sense amplifier 112 compares the reverse current flowing through the memory cell region MCmn with the reverse current flowing through the reference memory cell region RMCmn, and in the case where the difference is large, a voltage +VH (V) of a relatively high voltage level is outputted, and in the case where the difference is small, a voltage +VL (V) of a relatively low voltage level is outputted. Accordingly, in the case where the 1-bit data corresponding to "1" has been written in the reference memory cell region RMCmn, the sense amplifier 112 outputs +VH (V) when the 1-bit data corresponding to "0" is read in the memory cell region MCmn, and outputs +VL (V) when the 1-bit data of "1" is read.

As described above, according to the semiconductor storage device 1 of the embodiment, at the time of cell non-selection, a voltage is not applied to the ferroelectric film for data storage of the pn junction diode GD with the ferroelectric gate, and accordingly, the disturb characteristics can be improved. Besides, in the memory array of the conventional semiconductor storage device, although the predetermined voltage is applied to the non-selected word line, in the memory array of the semiconductor storage device 1 of this embodiment, the applied voltage of a very small value which can be regarded as 0 (V) is merely applied to the non-selected word line WL, and reduction in power consumption of the semiconductor storage device 1 can be realized.

Figure 16:
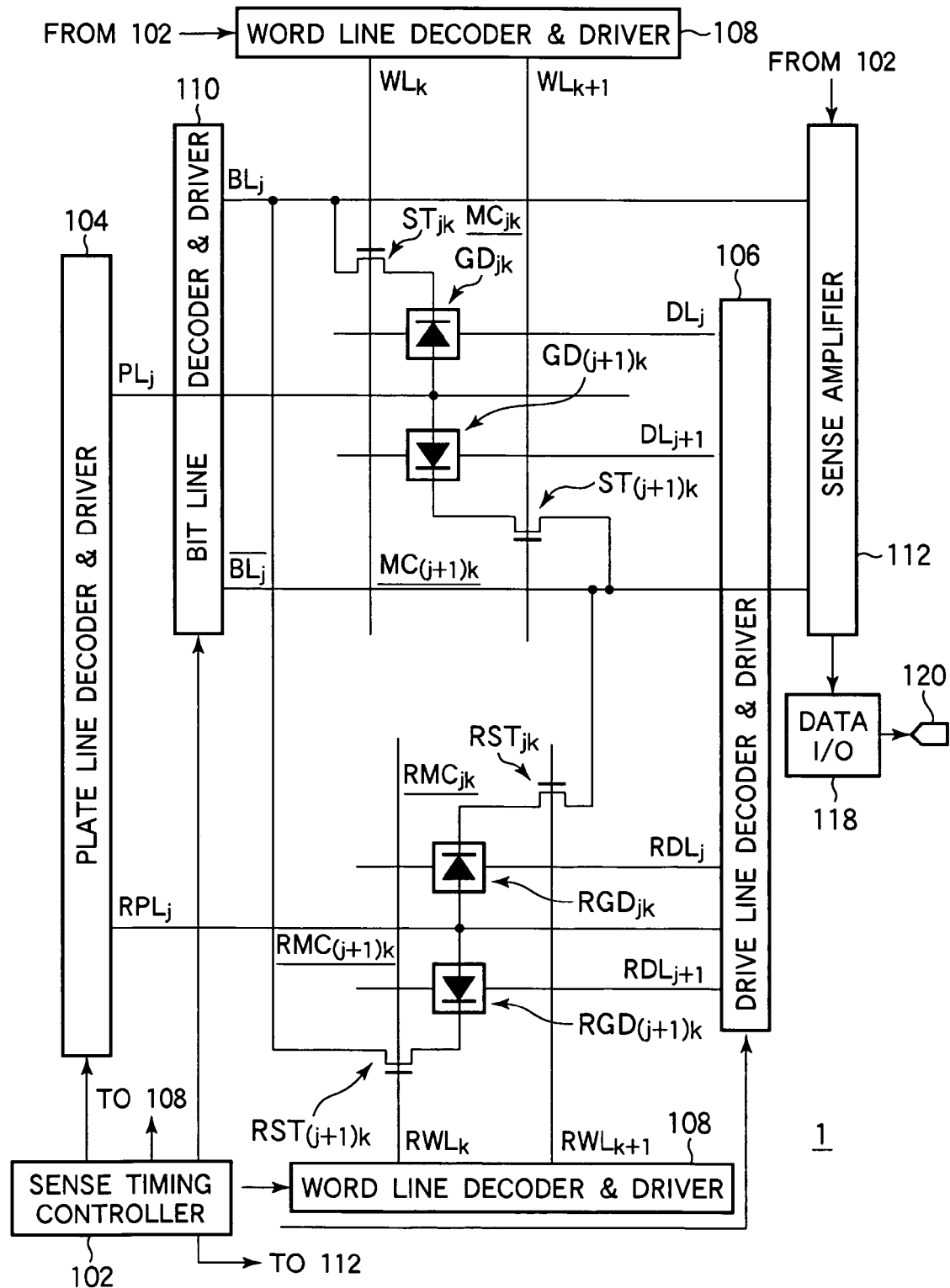
FIG. 16 is a view showing an equivalent circuit of a memory array structure of the semiconductor storage device 1 according to a modified example of the first embodiment of the invention.

Next, a modified example of the memory array structure of the semiconductor storage device 1 of this embodiment will be described with reference to FIG. 16. A semiconductor storage device 1 of the modified example is characterized in that memory cell regions of two rows are made a pair, a plate line PL is shared by them, and higher integration of a memory array is realized. FIG. 16 shows an equivalent circuit of a memory array structure of the semiconductor storage device 1 of this modified example. FIG. 16 shows a circuit example of 2×1 memory cells of the semiconductor storage device 1 having a memory cell array of m rows by n columns. Plural memory cell regions MCjk, MC(j+1)k are arranged in a matrix form, and plural word lines WLk, WLk+1 and plural bit lines BLj, /BLj ("/BLj" denotes inverted data of BLj) are arranged vertically and horizontally. Further, plural drive lines DLj, DLj+1 and plural plate lines PLj (FIG. 14 shows one line) are arranged in parallel to the bit lines BLj. The pn junction diodes GDjk, GD(j+1)k with the ferroelectric gates shown in FIG. 1 and the cell selection transistors STjk, ST(j+1)k connected to the diodes GDjk, GD(j+1)k are formed in each of memory cell regions MCjk, MC(j+1)k.

Hereinafter, although the circuit structure of the semiconductor storage device 1 will be described while the memory cell regions MCjk and MC(j+1)k are used as an example, the other memory cell regions MC(m−1)(n−1), MCmn have the same structure as the memory cell regions MCjk, MC(j+1)k. A gate terminal of the cell selection transistor STjk in the memory cell region MCjk is connected to a wordline WLk for inputting a cell selection signal, drain/source terminals are connected to a bit line BLj for inputting data, and a source terminal is connected to a cathode terminal of the pn junction diode GDjk with the ferroelectric gate.

An anode terminal of the pn junction diode GDjk with the ferroelectric gate is connected to a plate line PLj in which open/ground is switched at the writing/reading of data, and a gate terminal is connected to a drive line DLj for applying a voltage to invert the polarization direction of the data storage ferroelectric film.

The gate terminal of the cell selection transistor ST(j+1)k in the memory cell region MC(j+1)k is connected to the word line WLk+1 for applying a cell selection signal, the drain terminal is connected to the bit line /BLj for outputting data, and the source terminal is connected to the cathode terminal of the pn junction diode GD(j+1)k with the ferroelectric gate.

The anode terminal of the pn junction diode GD(j+1)k with the ferroelectric gate is connected to the plate line PLj in which open/ground is switched at writing/reading of data, and the gate terminal is connected to the drive line DLj+1 for applying a voltage to invert the polarization direction of the data storage ferroelectric film. As stated above, the plate line PLj is shared by the memory cell region MCjn at the jth row and the memory cell region MC(j+1)n at the (j+1)th row.

The word lines WLk and WLk+1 are connected to the word line decoder/driver circuit 108. The plate line PLj is connected to the plate line decoder/driver circuit 104. The drive lines DLj and DLj+1 are connected to the drive line decoder/driver circuit 106. The bit lines BLj and /BLj are connected to the bit line decoder/driver circuit 110. The respective decoder/driver circuits 104, 106, 108 and 110 are controlled by the sense timing controller 102, and predetermined voltages necessary for writing/reading are applied to the respective lines PLj, DLj, DLj+1, WLk, WLk+1, BLj and /BLj at predetermined timings.

The sense amplifier (S/A) 112 is connected to the terminal of the bit line BLj, /BLj at the side where it is not connected to the bit line decoder/driver circuit 110. The sense amplifier 112 determines "0" or "1" of the readout data read out from the memory cell region MCjk, MC(j+1)k.

The semiconductor storage device 1 includes a reference memory cell region RMC to output reference data used for the determination of "0" or "1" of the readout data read out from the memory cell region MC. For example, the number of the reference memory cell regions RMC is equal to that of the memory cell regions MC. FIG. 16 shows a circuit example of 2×1 reference memory cells in a m rows by n columns reference memory cell array. Plural reference memory cell regions RMCjk, RMC(j+1)k are arranged in a matrix form, and plural reference word lines RWLk, RWLk+1 are arranged to intersect with the reference plate lines RPLj. Further, plural reference drive lines RDLj, RDLj+1 and plural reference plate lines RPLj, RPLj+1 (FIG. 16 shows one line) are arranged in parallel to the bit line BLj.

In the reference memory cell region RMCjk, (j+1)k, the pn junction diode RGDjk, RGD(j+1)k and the cell selection transistor RSTjk, RST(j+1)k, which are respectively similar to the structures of the pn junction diode GDjk, GD(j+1)k with the ferroelectric gate and the cell selection transistor STjk, ST(j+1)k provided in the memory cell region MCjk, MC(j+1)k, are respectively formed.

Hereinafter, although the circuit structure of the semiconductor storage device 1 will be described while the reference memory cell region RMCjk, RMC(j+1)k is used as an example, the other reference memory cell regions RMC(m−1)(n−1), RMCmn have also the same structure. The gate terminal of the cell selection transistor RSTjk in the reference memory cell region RMCjk is connected to a reference word line RWLk+1 for applying a cell selection signal, a drain terminal is connected to a bit line /BLj for outputting data, and a source terminal is connected to a cathode terminal of the pn junction diode RGDjk with the ferroelectric gate.

The anode terminal of the pn junction diode GDjk with the ferroelectric gate is connected to the reference plate line RPLj in which open/ground is switched at writing/reading of data, and the gate terminal is connected to the reference drive line RDLj for applying a voltage to invert the polarization direction of the data storage ferroelectric film.

A gate terminal of the cell selection transistor RST(j+1)k in the reference memory cell region RMC(j+1)k is connected to the reference word line RWLk, a drain terminal is connected to the bit line BLj, and a source terminal is connected to the cathode terminal of the pn junction diode RGD(j+1)k with the ferroelectric gate.

An anode terminal of the pn junction diode GD(j+1)k with the ferroelectric gate is connected to the reference plate line RPLj in which open/ground is switched at writing/reading of data, and a gate terminal is connected to the reference drive line RDLj+1 for applying a voltage to invert the polarization direction of the ferroelectric film for data storage. Similarly to the memory cell region MC, the reference plate line RPLj is shared by the reference memory cell region RMCjn at the jth row and the reference memory cell region RMC(j+1)n at the (j+1)th row.

The reference word lines RWLk and RWLk+1 are connected to the word line decoder/driver circuit 108. The reference plate line RPLj is connected to the plate line decoder/driver circuit 104. The reference drive lines DLj and DLj+1 are connected to the drive line decoder/driver circuit 106.

The sense amplifier 112 is connected to a data I/O circuit 118. The data I/O circuit 118 is connected to an output part 120, and outputs readout data to, for example, an external system.

Next, an example of the writing operation of the semiconductor storage device 1 of the modified example will be described using the memory cell region MCjk and the reference memory cell RMCjk. By predetermined control signals outputted from the sense timing controller 102, the word line decoder/driver circuit 108 outputs the cell selection signal of the gate voltage of +V0 (V) to the word line WLk and the reference word line RWLk, the drive line decoder/driver circuit 106 applies the voltage of +V1 (V) to the drive line DLj and the reference drive line RDLJ, and the plate line decoder/driver circuit 104 opens the plate line PL1 and the reference plate line RPLj.

At the same time, the bit line decoder/driver circuit 110 causes the voltage of the bit line BLj to become 0 (V). By this, the cell selection transistor STjk and the pn junction diode GDjk with the ferroelectric gate provided in the memory cell region MCjk perform the writing operation similar to that described by use of FIGS. 4A and 4B, and 1-bit data corresponding to "0" is stored into the memory cell region MCjk. Besides, the cell selection transistor RSTjk and the pn junction diode RGDjk with the ferroelectric gate provided in the reference memory cell region RMCjk perform the writing operation similar to that described by use of FIGS. 5A and 5B, and 1-bit data corresponding to "1" is stored into the reference memory cell region RMCjk.

A not-shown memory cell region MCmk and reference memory cell region MCmk in which selection/non-selection is controlled by the word line WLk and the reference word line RWLk store 1-bit data corresponding to "0" or "1" based on the voltage applied to the bit line BLm, /BLm. In the selection period of the word line WLk and the reference word line RWLk, a very small voltage which can be regarded as 0 (V) is applied to the word line WLn and the reference word line RWLn other than the word line WLk and the reference word line RWLk, data is not written into the memory cell region MCmn and the reference memory cell region MCmn other than the memory cell region MCjk and the reference memory cell region RMCjk, and both the memory cell regions MCmn and RMCmn continue to store the already stored data.

Next, an example of the reading operation of the semiconductor storage device 1 will be described using the memory cell region MCjk and the reference memory cell region RMCjk. By predetermined control signals outputted from the sense timing controller 102, the word line decoder/driver circuit 108 outputs the cell selection signal of the gate voltage of +V0 (V) to the word line WLk and the reference word line RWLk, the drive line decoder/driver circuit 106 applies the voltage of 0 (V) to the drive line DLj and the reference drive line RDLj, and the plate line decoder/driver circuit 104 keeps the plate line PLj and the reference plate line RPLj at 0 V. At the same time, the bit line decoder/driver circuit 110 outputs the data reading voltage +Vr (V) for data reading to the bit line BLj, /BLj. At the time of the reading operation, the bit line decoder/driver circuit 110 outputs the data reading voltage +Vr (V) of the same voltage level to the bit line BLj, /BLj.

By this, a reverse bias voltage is applied to the pn junction diode GDjk with the ferroelectric gate in the memory cell region MCjk and the pn junction diode RGDjk with the ferroelectric gate in the reference memory cell region RMCjk. Since the 1-bit data corresponding to "0" has been stored in the memory cell region MCjk, only a reverse current I0(mA) which can be regarded as 0 (mA) flows through the pn junction diode GDjk with the ferroelectric gate. On the other hand, since the 1-bit data corresponding to "1" has been stored in the reference memory cell region RMCjk, a very large reverse current I1 (mA) as compared with the reverse current I0 flows through the pn junction diode RGDjk with the ferroelectric gate.

The sense amplifier 112 compares the reverse current I0 flowing through the memory cell region MCjk with the reverse current I1 flowing through the reference memory cell region RMCjk by the sense amplifier circuit. For example, a differential arithmetic operation is performed between the reverse current flowing through the memory cell region MCjk and the reverse current flowing through the reference memory cell region RMCjk and a current-voltage conversion processing is performed, so that a negative voltage −Vout (V) is outputted from the sense amplifier 112. Besides, when the 1-bit data corresponding to "1" has been stored in the memory cell region MCjk, the reverse current flowing through the memory cell region MCjk becomes I1, and the reverse current flowing through the reference memory cell region RMCjk becomes I0. Accordingly, by performing the above arithmetic operation processing, a positive voltage +Vout (V) is outputted from the sense amplifier 112. As stated above, with respect to the readout data from the memory cell region MCjk, "0" or "1" is determined based on the positive/negative of the voltage outputted from the sense amplifier 112.

As described above, according to the semiconductor storage device 1 of the modified example of this embodiment, the plate line PL is shared, so that higher integration can be realized. This system can be realized in the case where for example, an SOI substrate shown in FIGS. 18A and 18B is used.

Figure 17:
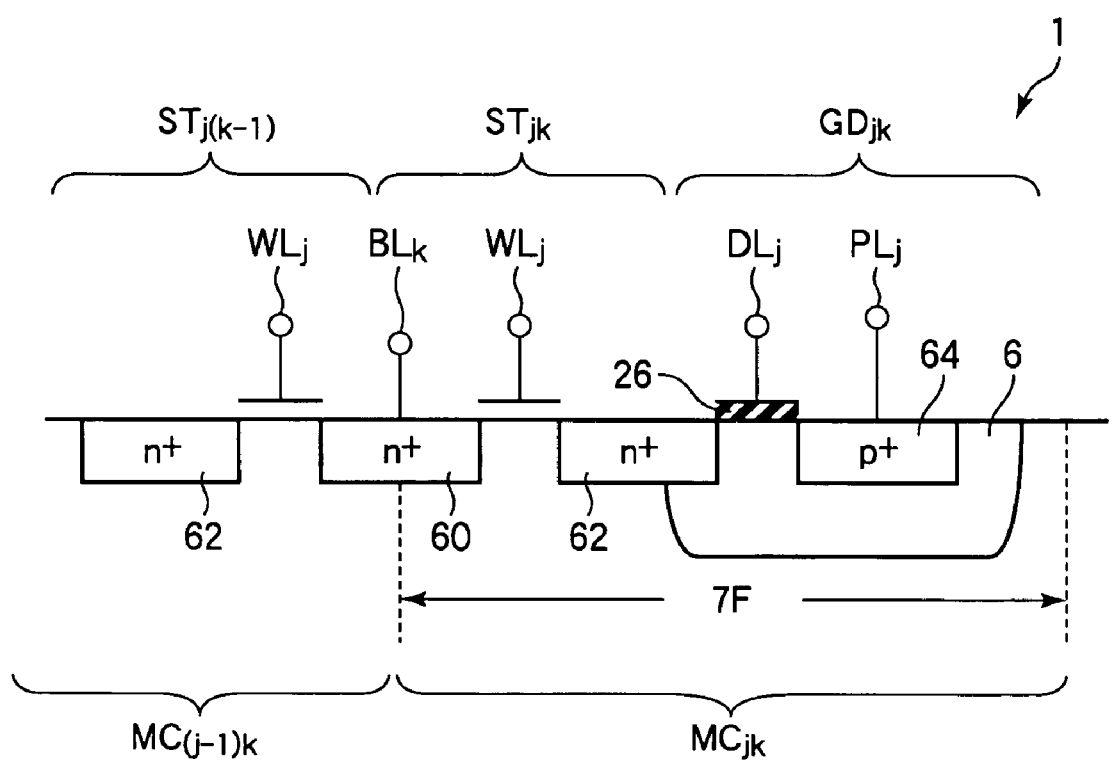
FIG. 17 is a view for explaining the possibility of integration and scaling of the memory array of the semiconductor storage device 1 according to the first embodiment of the invention.

Next, the possibility of integration and scaling of the memory array of the semiconductor storage device of this embodiment will be described. FIG. 17 schematically shows memory cells MCjk and MCj(k−1) of the semiconductor storage device. As shown in FIG. 17, when a contact of the anode region 64 is made $F^2$ ("F" denotes a minimum line width), the width of the n well 6 requires 3F. In FIG. 17, an interval between the memory cell MCjk and a not-shown memory cell MCj(k+1) arranged to be adjacent on the right side of the memory cell MCjk is made 1 F. Since the width of the memory cell MCjk in the vertical direction relative to the paper plane requires 4 F, the unit cell area of the memory cell MCjk becomes 7 F×4 F =28 $F^2$.

Figure 18A:
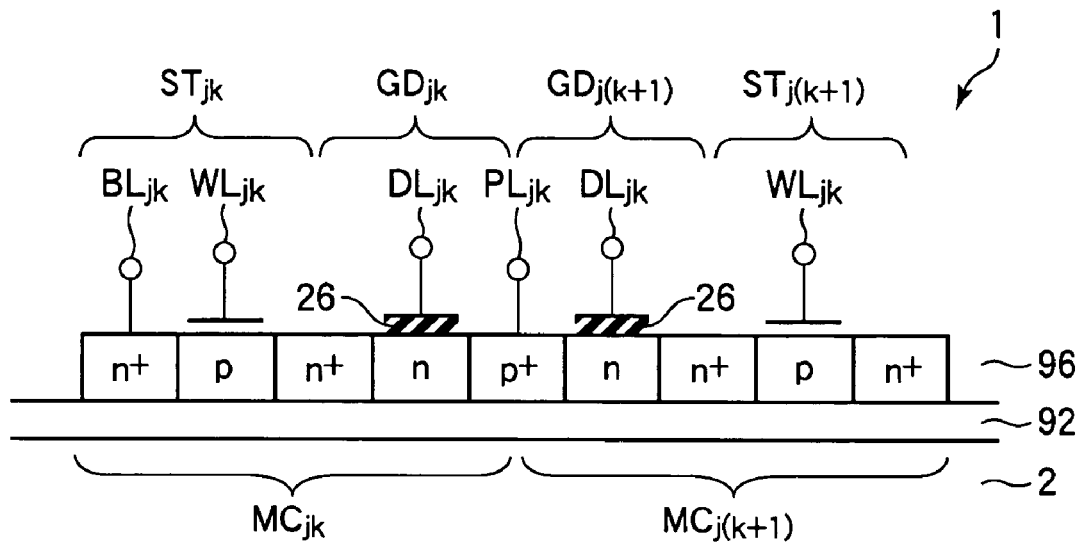
FIGS. 18A and 18B are views for explaining the possibility of integration and scaling of the memory array of the semiconductor storage device 1 according to the first embodiment of the invention.
Figure 18B:
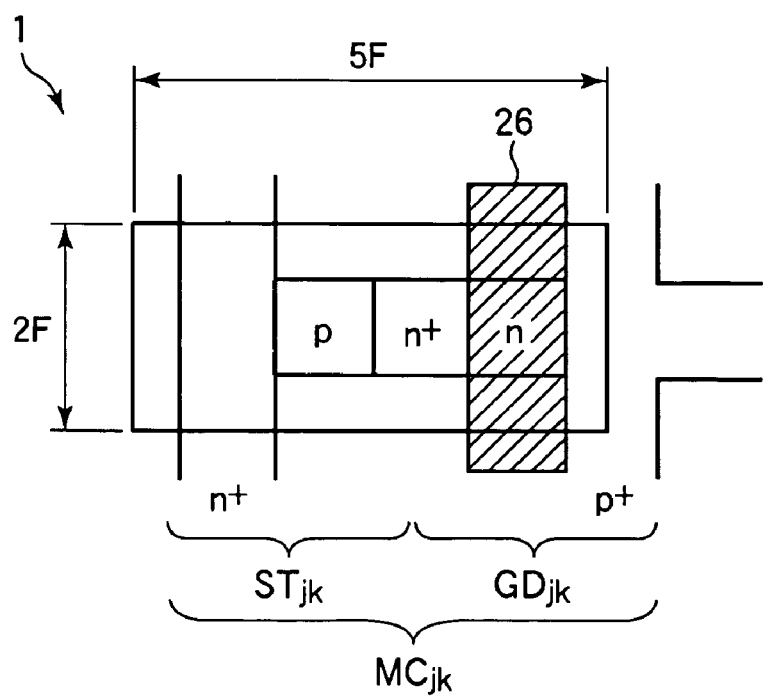

FIGS. 18A and 18B show the size of a unit cell area of the memory cell MCjk in the case where the SOI (Silicon on Insulator) substrate is used as the formation substrate of the semiconductor storage device 1. FIG. 18A schematically shows the sections of the memory cells MCjk and MCj(k+1) of the semiconductor storage device 1, and FIG. 18B schematically shows the memory cells MCjk and MCj(k+1) seen from the side of a single crystal silicon layer 96 formed on an insulating layer 92. As shown in FIGS. 18A and 18B, when the SOI substrate is used as the formation substrate of the semiconductor storage device 1, since the n⁻ well may not be formed, the unit cell area of the memory cell MCjk can be further decreased. As shown in FIG. 18B, when an interval between adjacent memory cells is made 1 F, the unit cell area of the memory cell MCjk can be reduced to 5 F×2 F=10 $F^2$.

The memory cell region shown in FIG. 17 to FIG. 18B has the structure in which the cell selection transistor ST and the pn junction diode GD with the ferroelectric gate are arranged on the same plane. However, when the three-dimensionalization of a transistor is used, since the memory cell region can be made to have a three-dimensional structure, the unit cell area is further reduced.

As described above, according to this embodiment, since the semiconductor storage device 1 can store data into the ferroelectric film 26 of the pn junction diode GD with the ferroelectric gate, as compared with the conventional 1T1C type in which data is written into the ferroelectric capacitor, scaling and high integration can be realized. Besides, in the semiconductor storage device 1, at the time of writing/reading of data, it is not necessary to apply a voltage to the ferroelectric film 26 for data storage of the non-selected cell, and accordingly, as compared with the conventional FET-type 1T FeRAM, the disturb characteristics can be improved, and the reduction in power consumption of the semiconductor storage device can be realized.

Second Embodiment

A semiconductor storage device according to a second embodiment of the invention, a data writing method thereof, a data reading method thereof, and a manufacturing method thereof will be described with reference to FIG. 19 to FIG. 21B. A semiconductor storage device 100 of this embodiment is characterized by including a transistor-type ferroelectric storage element MT provided with a ferroelectric film for data storage, a pn junction diode D electrically connected to the transistor-type ferroelectric storage element MT, and a cell selection transistor ST electrically connected to the pn junction diode D. When the memory cell is made to have the structure as stated above, the current-voltage characteristic of the pn junction diode D can be made different from the current-voltage characteristic of the pn junction diode GD with the ferroelectric gate according to the above-described embodiment. By this, the ratio of an on current at the time of reading of 1-bit data corresponding to "1" to an off current at the time of reading of 1-bit data corresponding to "0" can be made large.

Figure 19:
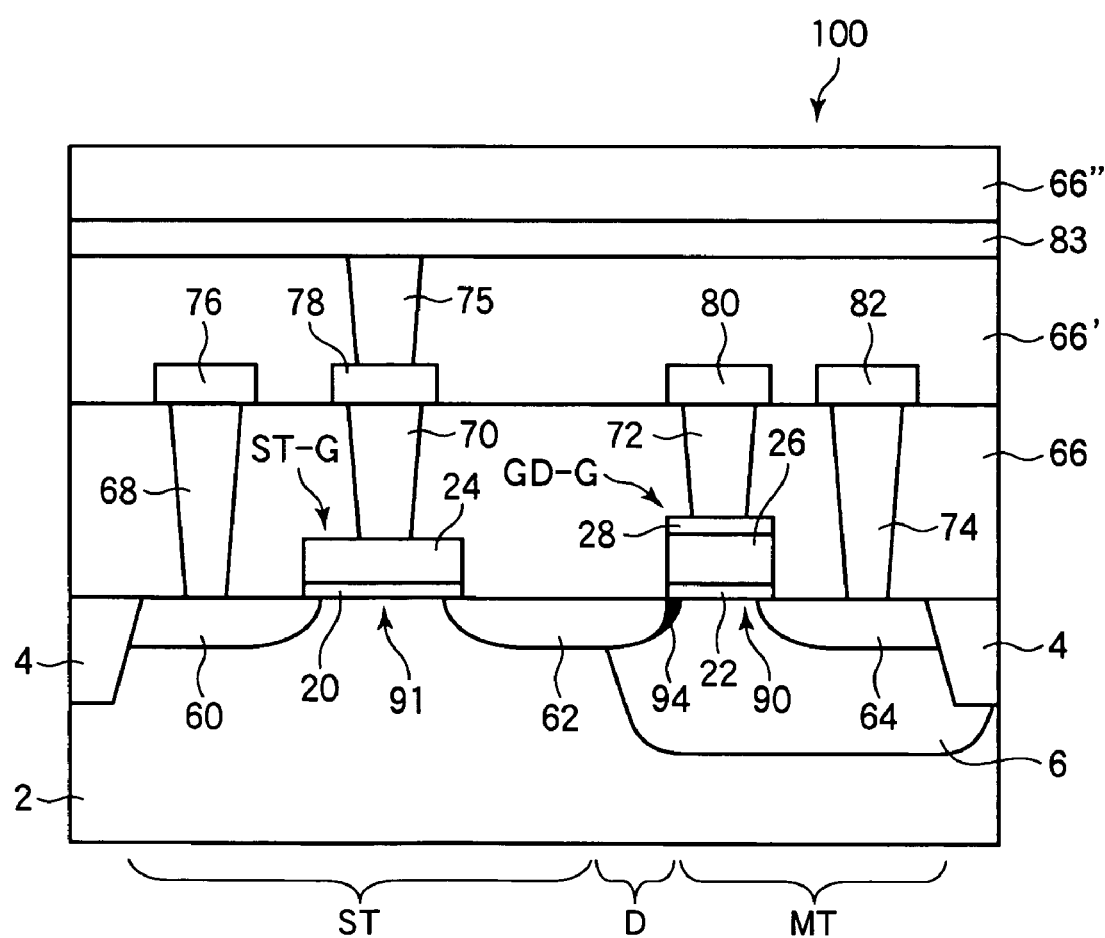
FIG. 19 is a view showing a sectional structure, perpendicular to a substrate surface, of one memory cell of a semiconductor storage device 100 according to a second embodiment of the invention, and the semiconductor storage device 100 includes a transistor-type ferroelectric storage element MT provided with a ferroelectric film, a pn junction diode D and a cell selection transistor ST are connected to one another.

First, the structure of the semiconductor storage device 100 of this embodiment will be described with reference to FIG. 19. FIG. 19 shows a sectional structure, perpendicular to the substrate surface, of one memory cell of the semiconductor storage device 100 in which the transistor-type ferroelectric storage element MT provided with the ferroelectric film, the pn junction diode D and the cell selection transistor ST are connected to one another. As shown in FIG. 19, the memory cell of the semiconductor storage device 100 includes the p-type transistor-type ferroelectric storage element MT arranged in an n⁻ well 6 formed in a p-type silicon semiconductor substrate 2. The transistor-type ferroelectric storage element MT includes a ferroelectric film 26 for data storage formed on the semiconductor substrate 2, a gate electrode 28 formed on the ferroelectric film 26, an inversion layer formation region 90 in which an inversion layer (channel) is formed in the semiconductor substrate 2 below the ferroelectric film 26 according to the polarization direction of the ferroelectric film 26, and a source region 64 and a drain region 94 of p-type impurity diffusion regions formed on both sides of the inversion layer formation region 90. The drain region 94 is a p+ region of a relatively high concentration impurity formed by implanting B (boron) into a cathode region 62 of the pn junction diode D. The drain region 94 has a conductivity opposite to the cathode region, and is formed between the cathode region 62 and the inversion layer formation region 90.

The semiconductor storage device 100 includes the pn junction diode D whose anode region is electrically connected to the drain region 94 of the transistor-type ferroelectric storage element MT. The drain region 94 constitutes the p-type impurity region of the transistor-type ferroelectric storage element MT, and at the same time, constitutes the anode region of the pn junction diode D. The cathode region 62 is arranged adjacently to the drain region 94. The cathode region 62 is an n-type impurity region of a relatively high concentration impurity.

The semiconductor storage device 100 includes the cell selection transistor ST electrically connected to the pn junction diode D. The cell selection transistor ST has the same structure as the cell selection transistor provided in the semiconductor storage device 1 according to the first embodiment, except that the cathode region 62 of the pn junction diode D constitutes the source region.

Incidentally, the semiconductor storage device 100 of this embodiment is manufactured by the same manufacturing method of the semiconductor storage device 1 of the first embodiment, except that a B (boron) ion is implanted into the cathode region 62 of the pn junction diode D obliquely to the substrate 2 to form the drain region 94. Accordingly, a description of the manufacturing method of the semiconductor storage device 100 of the embodiment will be omitted.

Figure 20A:
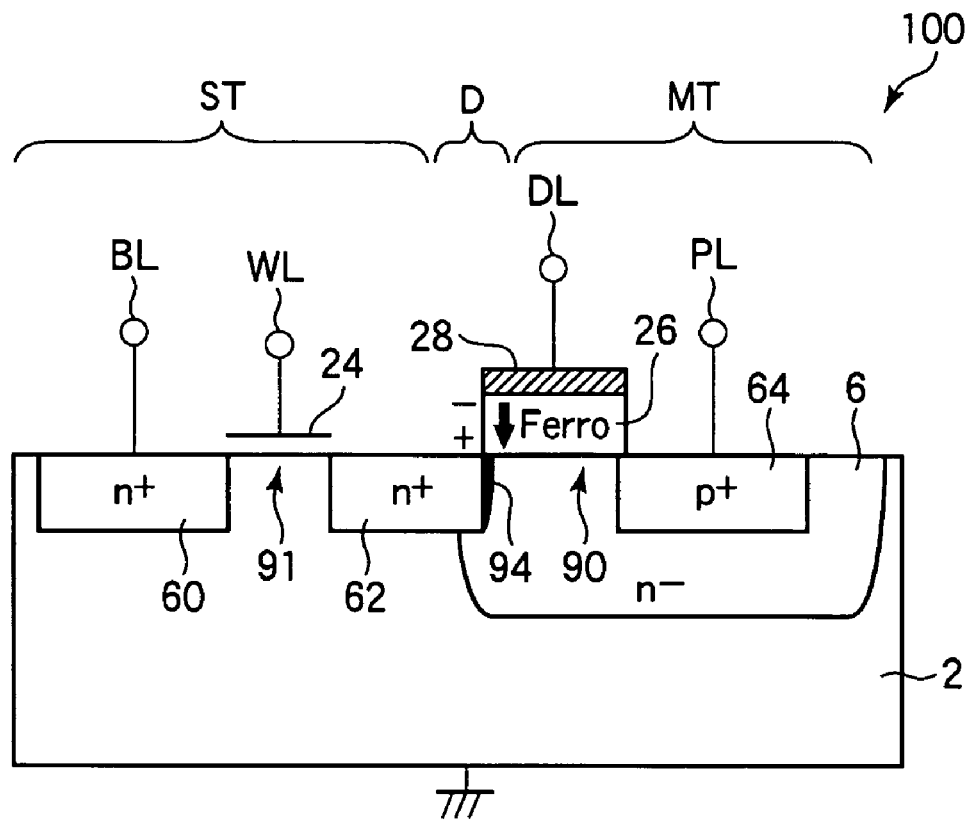
FIGS. 20A and 20B are views showing a state in which 1-bit data of "0" has been written in the memory cell of the semiconductor storage device 100 according to the second embodiment of the invention.
Figure 20B:
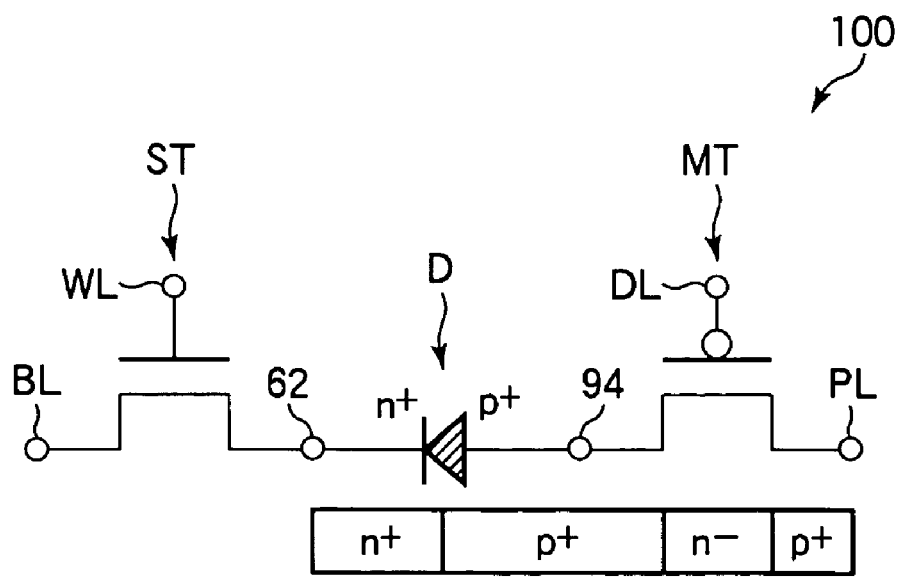

FIGS. 20A and 20B show a state where 1-bit data corresponding to "0" has been written in the memory cell of the semiconductor storage device 100. FIG. 20A schematically shows the memory cell of the semiconductor storage device 100, and FIG. 20B shows an equivalent circuit of the memory cell of the semiconductor storage device 100.

As shown in FIG. 20A, since the 1-bit data corresponding to "0" has been stored in the memory cell, the ferroelectric film 26 for data storage is polarized downward in the drawing as indicated by a thick arrow. Since the surface of the data storage ferroelectric film 26 on the semiconductor substrate 2 side is positively (+) charged, electrons are collected in the inversion layer formation region 90, and an inversion layer is not formed. Accordingly, as shown in FIG. 20B, the transistor-type ferroelectric storage element MT has (p+)(n−)(p+), and can be regarded as the p-type MOSFET in the off state. Besides, the pn junction diode D can be regarded as a diode with a low breakdown voltage in which the p+ region and the n+ region are connected.

Figure 21A:
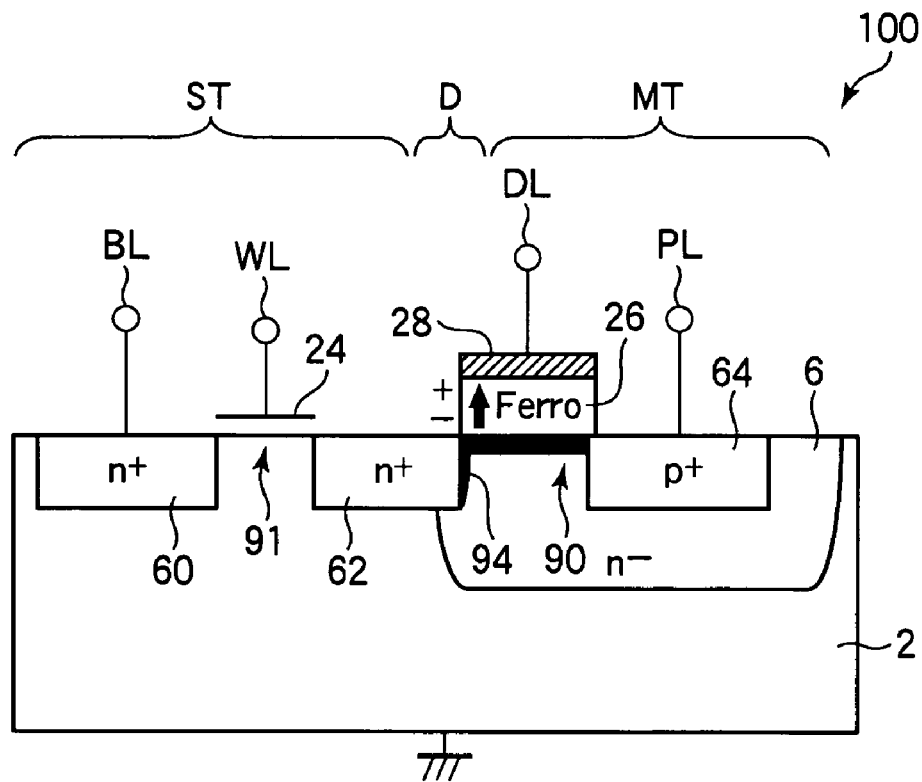
FIGS. 21A and 21B are views showing a state in which 1-bit data of "1" has been written in the memory cell of the semiconductor storage device 100 according to the second embodiment of the invention.
Figure 21B:
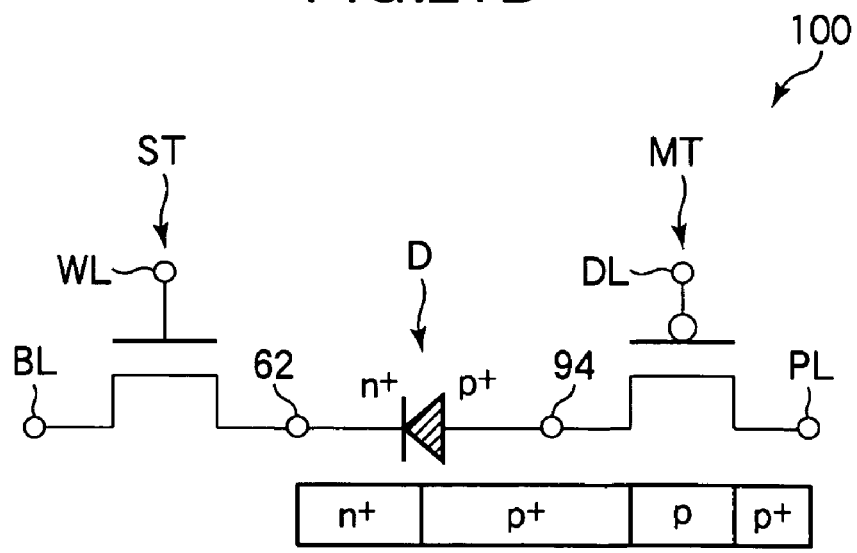

FIGS. 21A and 21B show a state in which 1-bit data corresponding to "1" has been written in the memory cell of the semiconductor storage device 100. FIG. 21A schematically shows the memory cell of the semiconductor storage device 100, and FIG. 21B shows an equivalent circuit of the memory cell of the semiconductor storage device 100. As shown in FIG. 21A, when the 1-bit data corresponding to "1" has been stored in the memory cell, the ferroelectric film 26 for data storage is polarized upward in the drawing as indicated by a thick arrow. Thus, since the surface of the data storage ferroelectric film 26 on the semiconductor substrate 2 side is negatively (−) charged, positive holes are collected in the inversion layer formation region 90 and the p-type inversion layer is formed. Accordingly, as shown in FIG. 21B, the transistor-type ferroelectric storage element MT has (p+)(p)(p+), and can be regarded as a p-type MOSFET in the on state.

Next, the data writing operation of the semiconductor storage device 100 of this embodiment will be described with reference to FIG. 3 and FIGS. 20A to 21B. As shown in FIG. 3, at the time of writing of the 1-bit data corresponding to "0", +V0 (V), 0 (V) and +V1 (V) are applied to the respective lines WL, BL and DL, and the plate line PL is put in the open state. As shown in FIG. 20A, a part of the cathode region 62 of the pn junction diode D is formed in the n− well 6. Thus, when the cell selection transistor ST is put in the on state, 0 (V) is applied to the cathode region 62 of the pn junction diode D and the n− well 6. Since the voltage of +V1 (V) is applied to the gate electrode 28 of the transistor-type ferroelectric storage element MT, as shown in FIG. 20A, the ferroelectric film 26 for data storage is polarized downward as indicated by the thick arrow in FIG. 20A.

As shown in FIG. 3, at the time of writing of the 1-bit data corresponding to "1", +V0 (V), +V1 (V) and 0 (V) are respectively applied to the respective lines WL, BL and DL, and the plate line PL is put in the open state. When the cell selection transistor ST is put in the on state, +V1 (V) is applied to the cathode region 62 of the pn junction diode D and the n− well 6. Since the voltage of 0(V) is applied to the gate electrode 28 of the transistor-type ferroelectric storage element MT, as shown in FIG. 21A, the ferroelectric film 26 for data storage is polarized upward as indicated by the thick arrow of FIG. 21A.

Next, the data reading operation of the semiconductor storage device 100 according to this embodiment will be described with reference to FIG. 6 and FIGS. 20A to 21B. As shown in FIG. 6, at the time of reading of the 1-bit data corresponding to "0" or "1", +V0 (V), +Vr (V) and 0 (V) are respectively applied to the respective lines WL, BL and DL, and the plate line PL is grounded. Since the pn junction diode D can be regarded as the p+n+ junction diode, it is in the conduction state in both a forward bias voltage and a reverse bias voltage. However, as shown in FIG. 20A, in the transistor-type ferroelectric storage element MT in which the 1-bit data corresponding to "0" has been written, since the inversion layer is not formed, even if the voltage of 0 (V) is applied to the drive line DL, the off state is kept. As shown in FIG. 20B, at the time of reading of the 1-bit data corresponding to "0", the pn junction diode D and the transistor-type ferroelectric storage element MT are put in the state of (n+)(p+)(n−) (p+), and a current hardly flows through the memory cell.

On the other hand, in the transistor-type ferroelectric storage element MT in which the 1-bit data corresponding to "1" has been written, as shown in FIG. 21A, the inversion layer is formed and it is in the on state. As shown in FIG. 21B, at the time of reading of the 1-bit data corresponding to "1", the pn junction diode D and the transistor-type ferroelectric storage element MT are put in the state of (n+)(p+)(p)(p+), and a relatively large current flows through the memory cell. As stated above, since the magnitude of the current flowing through the memory cell varies according to the data to be read out, the value of the readout data can be determined.

In the pn junction diode D of this embodiment, as compared with the pn junction diode GD with the ferroelectric gate according to the above-described embodiment, the p+ region and the n+ region are connected with a relatively large area. Thus, since the pn junction diode D has a lower breakdown voltage than the pn junction diode GD with the ferroelectric gate, the value of the data reading voltage Vr can be made small. By this, the reduction in power consumption of the semiconductor storage device 100 can be realized, and an influence on the polarization of the ferroelectric film at the time of reading becomes low.

Third Embodiment

A semiconductor storage device according to a third embodiment of the invention, a data writing method thereof, a data reading method thereof, and a manufacturing method thereof will be described with reference to FIG. 22 to FIG. 24B. In the pn junction diode GD with the ferroelectric gate of the semiconductor storage device 1 of the first embodiment, the p$^+$ layer as the inversion layer is formed in the inversion layer formation region 90 according to the polarization direction of the ferroelectric film 26. By this, the pn junction diode GD with the ferroelectric gate functions as the p$^+$n$^+$ junction diode. However, when the pn junction between the inversion layer and the cathode region 62 is not satisfactory, the current-voltage characteristic as the p$^+$n$^+$ junction diode can not be satisfactorily obtained. Thus, in the semiconductor storage device 1 including the pn junction diode GD with the ferroelectric gate, the ratio (on/off ratio) of the on current at the time of reading of 1-bit data of "1" to the off current at the time of reading of 1-bit data of "0" can not be satisfactorily obtained, and there is a possibility that the stored data can not be accurately read.

Figure 22:
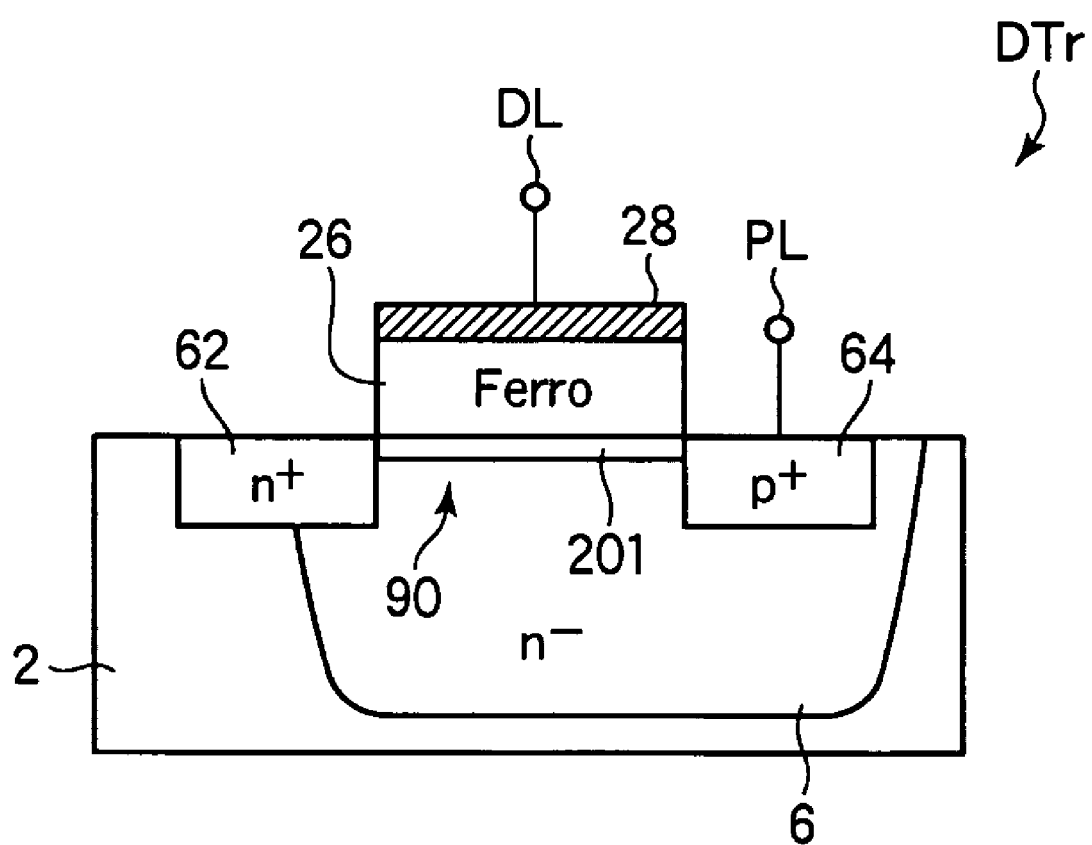
FIG. 22 is a view schematically showing a sectional structure, perpendicular to a substrate surface, of a depletion-type p-channel transistor DTr with a ferroelectric gate.

FIG. 22 schematically shows a sectional structure, perpendicular to the substrate surface, of a depletion-type p-channel transistor with a ferroelectric gate (hereinafter referred to as a depletion-type ferroelectric transistor) DTr. As shown in FIG. 22, the depletion-type ferroelectric transistor DTr includes a p$^+$ layer 201 in an inversion layer formation region 90. A p$^+$n$^+$ junction diode is formed of the p$^+$ layer 201 and an n-type cathode region 62. Accordingly, the semiconductor storage device including the depletion-type ferroelectric transistor DTr instead of the pn junction diode GD with the ferroelectric gate can obtain a satisfactory on/off ratio for data reading.

In the depletion-type ferroelectric transistor DTr, in order to cause a reverse conduction characteristic, such as a tunnel effect, to occur remarkably, when it is assumed that the maximum quantity of charge induced in an SiO$_2$ film is about 3.5 μC/cm$^2$, and the maximum quantity of charge induced in a HfO$_2$ film is 1.6 μC/cm$^2$ (1×10$^{13}$ cm$^{-2}$), it is necessary that the p$^+$ inversion layer has an impurity concentration of about 5×10$^{19}$ cm$^{-3}$.

In order to completely deplete the inversion layer formation region 90 by the induced charge quantity, the thickness of the p$^+$ layer 201 must be 5 nm or less. Further, since the sharpness of the p$^+$n$^+$ junction between the p$^+$ layer 201 and the cathode region 62 is also required, it is very difficult to produce the p$^+$ layer 201 by an ion implantation method.

Then, in the second embodiment, aB (boron) ion is implanted into the cathode region 62 obliquely to the substrate 2 to form a drain region 94, so that the pn junction diode D having the reverse conduction characteristic is constructed. On the other hand, in this embodiment, the p$^+$ region adjacent to the n$^+$ region is definitely formed, so that the pn junction diode is constructed. By this, the semiconductor storage device can have a large on/off ratio at the time of data reading. That is, similarly to the second embodiment, the memory cell of the semiconductor storage device of this embodiment has the structure of a 1 transistor-1 diode-1 transistor (1T1D1T) type.

Figure 23:
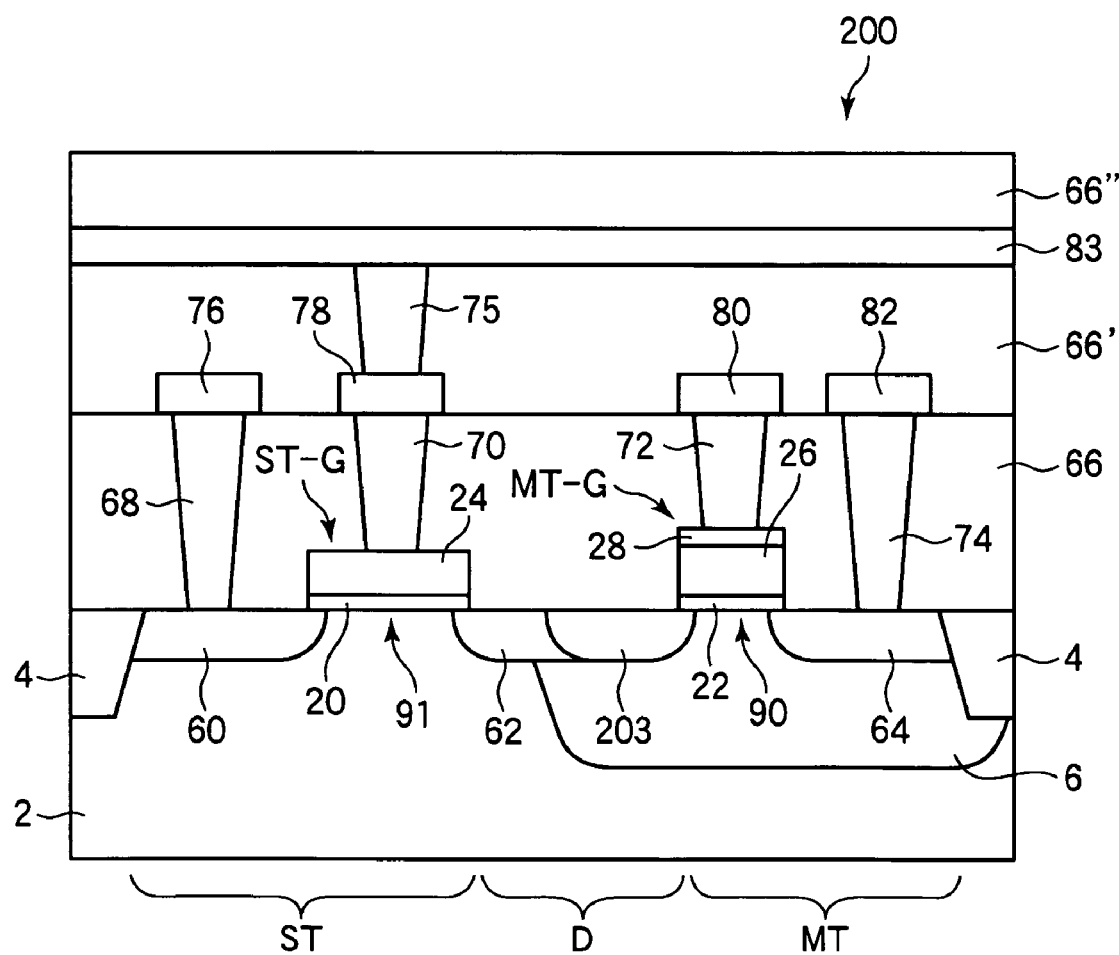
FIG. 23 is a view showing a sectional structure, perpendicular to a substrate surface, of one memory cell of a semiconductor storage device 200 according to a third embodiment of the invention, and the semiconductor storage device 200 includes a transistor-type ferroelectric storage element MT provided with a ferroelectric film, a pn junction diode D and a cell selection transistor ST are connected to one another.

First, the structure of the semiconductor storage device 200 of this embodiment will be described with reference to FIG. 23. FIG. 23 shows a sectional structure, perpendicular to the substrate surface, of one memory cell of a semiconductor storage device 200 in which a transistor-type ferroelectric storage element (storage semiconductor element) MT provided with a ferroelectric film, a pn junction diode D, and a cell selection transistor ST are connected to one another. As shown in FIG. 23, the memory cell of the semiconductor storage device 200 includes a p-type transistor-type ferroelectric storage element MT which is formed in a silicon semiconductor substrate 2 of a first conductivity type (p type) and is arranged in an n$^-$ well (well region) 6 having a conductivity type (n type) different from the first conductivity type. The transistor-type ferroelectric storage element MT includes a gate insulating film 22 formed on an n$^-$ well 6, a data storage ferroelectric film 26 formed on the gate insulating film 22, a gate electrode 28 formed on the ferroelectric film 26, an inversion layer formation region 90 in which an inversion layer (channel) is formed in an n$^-$ well 6 in a lower layer of the ferroelectric film 26 according to the polarization direction of the ferroelectric film 26, a source/drain region 64 of a p-type impurity diffusion region (first impurity activated region) formed on one of both sides of the inversion layer formation region 90, and a drain/source region 203 (hereinafter, if necessary, referred to as "anode region") of a p-type impurity diffusion layer (second impurity activated region) formed on the other of both the sides. In the case where an excellent interface with a few carrier trap levels is obtained, the gate insulating film 22 is not formed, and the ferroelectric film 26 may be directly formed on the n$^-$ well 6 of the semiconductor substrate 2.

Further, the semiconductor storage device 200 includes a pn junction diode D electrically connected to the transistor-type ferroelectric storage element MT. The drain/source region 203 constitutes the p-type impurity region of the transistor-type ferroelectric storage element MT, and at the same time, constitutes the anode region of the pn junction diode D. A cathode region 62 formed to extend over the p-type impurity region of the semiconductor substrate 2 and the n$^-$ well 6 and adjacent to the drain/source region 203 is arranged in the memory cell. The cathode region 62, the anode region 203, and the n$^-$ well 6 are electrically connected to one another. The cathode region 62 is an n-type impurity activated region (third impurity activated region). In the anode region 203 and the cathode region 62, the impurity concentration is formed to be relatively high, and the pn junction diode D functions as a reverse conduction diode.

The semiconductor storage device 200 includes a cell selection transistor ST electrically connected to the pn junction diode D. The cell selection transistor ST has the same structure as the cell selection transistor provided in the semiconductor storage device 1 of the first and the second embodiments, except that the cathode region 62 of the pn junction diode D constitutes the source/drain region. Incidentally, the data writing and the date reading methods of the semiconductor storage device 200 of this embodiment are same as those of the semiconductor storage device 100 of the second embodiment, a description will be omitted.

The memory cell of the semiconductor storage device 200 has the structure in which the three regions of the source/drain region 62 of the n-type cell selection transistor ST, the n$^-$ well 6 in the p-type semiconductor substrate 2, and the drain/source region 203 of the p-type transistor-type ferroelectric storage element MT are electrically connected to one another through the pn junction diode D. In the semiconductor storage device 200, since the drain/source region 60 and the n$^-$ well 6 are electrically connected, similarly to the first and the second embodiments, data voltage can be applied to the whole surface of the inversion layer formation region 90 below the ferroelectric film 26 at the time of data writing. Thus, the data voltage is uniformly applied to the whole surface of the ferroelectric film 26 on the semiconductor substrate 2 side. On the other hand, the voltage applied to the gate electrode 28 is uniformly applied to the whole surface of the ferroelectric film 26 on the gate electrode 28 side. By this, since the voltage is uniformly applied to the ferroelectric film 26 in the film thickness direction, the semiconductor storage device 200 can prevent poor data writing.

Besides, similarly to the second embodiment, in the semiconductor storage device 200, at the time of reading of the 1-bit data corresponding to "0", the pn junction diode D and the transistor-type ferroelectric storage element MT are put in a state of $(n^+)(p^+)(n^-)(p^+)$ (see FIG. 20B), and at the time of reading of the 1-bit data corresponding to "1", they are put in a state of $(n^+)(p^+)(p)(p^+)$ (see FIG. 21B). Thus, in the memory cell of the semiconductor storage device 200, at the time of reading of the 1-bit data corresponding to "0", a current hardly flows, and at the time of reading of the 1-bit data corresponding to "1", a relatively large current flows, and accordingly, a large on/off ratio is obtained. By this, the semiconductor storage device 200 can prevent poor data reading. Accordingly, the semiconductor storage device 200 can realize a stable memory operation in the data writing/reading.

As described above, in the semiconductor storage device 200 of this embodiment, similarly to the first and the second embodiments, the polarization direction of the ferroelectric film 26 is inverted according to the magnitudes of the voltage applied to the gate electrode 28 and the data voltage applied to the $n^-$ well 6, and data can be written. Besides, the semiconductor storage device 200 can read the data by using that the magnitude of the current flowing through the memory cell varies according to the polarization direction of the ferroelectric 26.

Figure 24A:
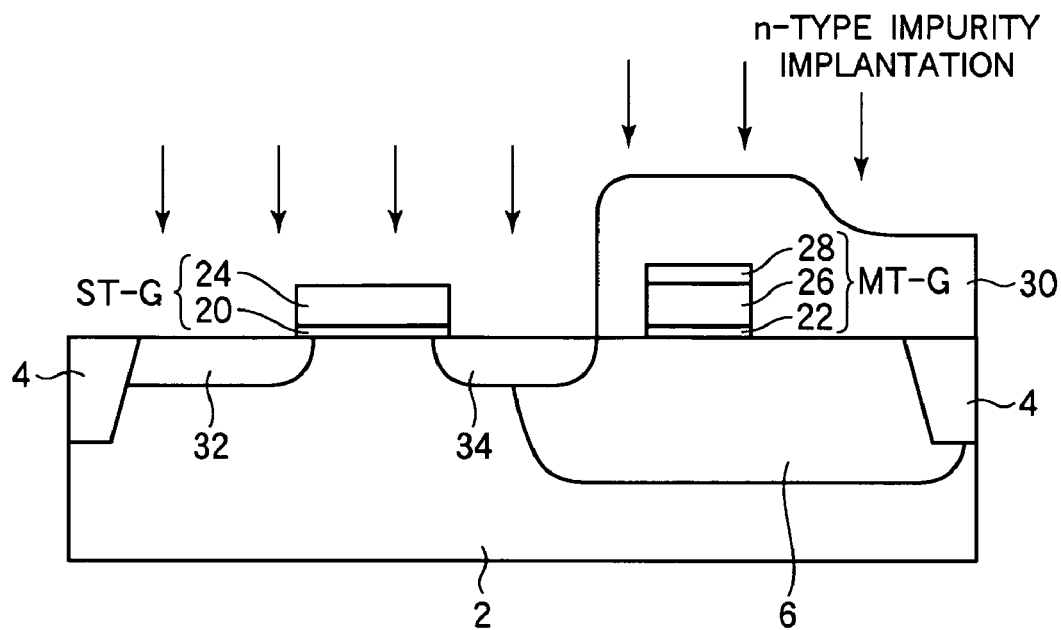
FIGS. 24A and 24B are process sectional views showing a manufacturing method of the semiconductor storage device 200 according to the third embodiment of the invention.
Figure 24B:
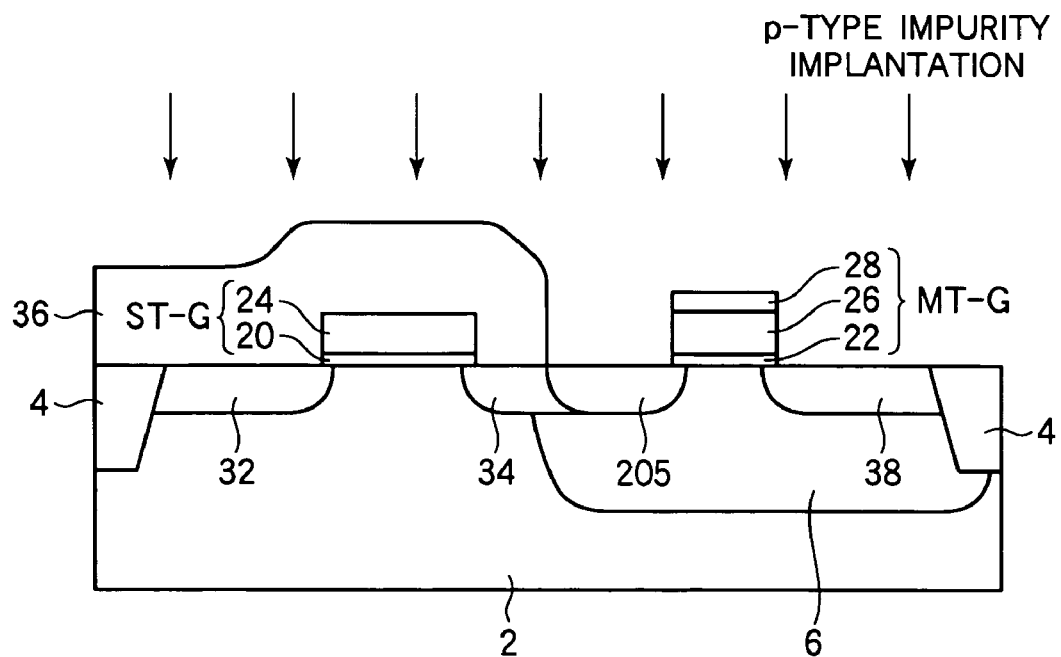

Next, a manufacturing method of the semiconductor storage device 200 of this embodiment will be described with reference to FIGS. 24A and 24B. FIGS. 24A and 24B are process sectional views showing the manufacturing method of the semiconductor storage device 200 of this embodiment. First, by the same manufacturing method as that of the first embodiment, portions up to a gate portion ST-G of a cell selection transistor ST are formed (see FIG. 9A to FIG. 11A).

Next, as shown in FIG. 24A, a resist is applied and patterning is performed to form a resist layer 30 which covers the whole of a gate portion MT-G of a transistor-type ferroelectric storage element MT and in which a part of an $n^-$ well 6 on the gate portion ST-G side of the cell selection transistor ST is exposed. Subsequently, for example, an ion implantation method is used, and while the resist layer 30 and the gate portion ST-G are used as masks, an n-type impurity, such as P (phosphorus) or As (arsenic), is introduced into a region of the semiconductor substrate 2, and n-type impurity regions 32 and 34 are formed. For example, the implantation condition of P is such that an acceleration energy is 30 keV to 70 keV, and a dosage is $2\times10^{15}$ $cm^{-2}$ to $1\times10^{16}$ $cm^{-2}$, and preferably, an acceleration energy is 50 keV, and a dosage is $5\times10^{15}$ $cm^{-2}$ and the ion implantation is performed. Thereafter, the resist layer 30 is removed.

Next, as shown in FIG. 24B, a resist is applied and patterning is performed to form a resist layer 36 which covers the whole gate portion ST-G and in which a part of the n-type impurity region 34 on the gate portion MT-G side is exposed. Subsequently, for example, the ion implantation method is used, and while the resist layer 36 and the gate portion MT-G are used as masks, a p-type impurity such as B (boron) is introduced into the semiconductor substrate 2 to form p-type impurity regions 38 and 205. For example, the implantation condition of B is such that an acceleration energy is 20 keV to 60 keV, and a dosage is $2\times10^{16}$ $cm^{-2}$ to $2\times10^{17}$ $cm^{-2}$, and preferably, an acceleration energy is 40 keV, and a dosage is $8\times10^{16}$ $cm^{-2}$, and ion implantation is performed. Thereafter, the resist layer 36 is removed.

Next, an annealing treatment is performed using a rapid lamp heating apparatus, and the implanted impurity is activated. This annealing treatment is performed at, for example, a heating temperature (attained temperature) of from 700° C. to 1000° C., and for a heating time of from 20 s to 120 s. By this, the impurity regions 32, 34, 38 and 205 shown in FIG. 24B are activated, and as shown in FIG. 23, the drain/source region 60 and the source/drain region 62 (cathode region 62) on both sides of the gate portion ST-G, and the source/drain region 64 and the drain/source region 203 (anode region 203) on both sides of the gate portion MT-G are formed. By this, the pn junction diode D is formed. Thereafter, the semiconductor storage device 200 shown in FIG. 23 is completed through the manufacturing process similar to that of the first embodiment.

In the manufacturing method of the semiconductor storage device 200 of this embodiment, the anode region 203 is formed by introducing the p-type impurity with the dosage larger than the dosage of the n-type impurity by one digit into the $n^-$ well 6 and the part of the n-type impurity region 34. Thus, it is prevented that the anode region 203 and the cathode region 34 are formed to be isolated from each other, and the pn junction diode D including the anode region 203 and the cathode region 34 is formed. Besides, since the anode region 203 and the cathode region 34 have relatively high impurity concentrations, the pn junction diode D has a reverse conductivity characteristic like a tunnel diode or a backward diode.

As described above, according to this embodiment, since the anode region 203 adjacent to the cathode region 62 is definitely formed as the well region, the pn junction diode D having a large contact area can be formed. Besides, the cathode region 62 and the anode region 203 have high impurity concentrations to such a degree that the pn junction diode D reveals the reverse conduction characteristic. By this, since, for example, a large tunnel current flows through the pn junction diode D, the on/off ratio at the time of data reading is improved. Accordingly, the semiconductor storage device 200 can prevent poor data reading. Besides, according to this embodiment, the semiconductor storage device 200 can be manufactured by the manufacturing process almost similar to that of the first embodiment. Further, according to this embodiment, since the semiconductor storage device 200 can store data into the transistor-type ferroelectric storage element MT, the ferroelectric capacitor may not be provided in the memory cell. Thus, the semiconductor storage device 200 functions as a nonvolatile memory which is small, has high reliability, and has almost no limit in the number of times of data reading.

Fourth Embodiment

Figure 25:
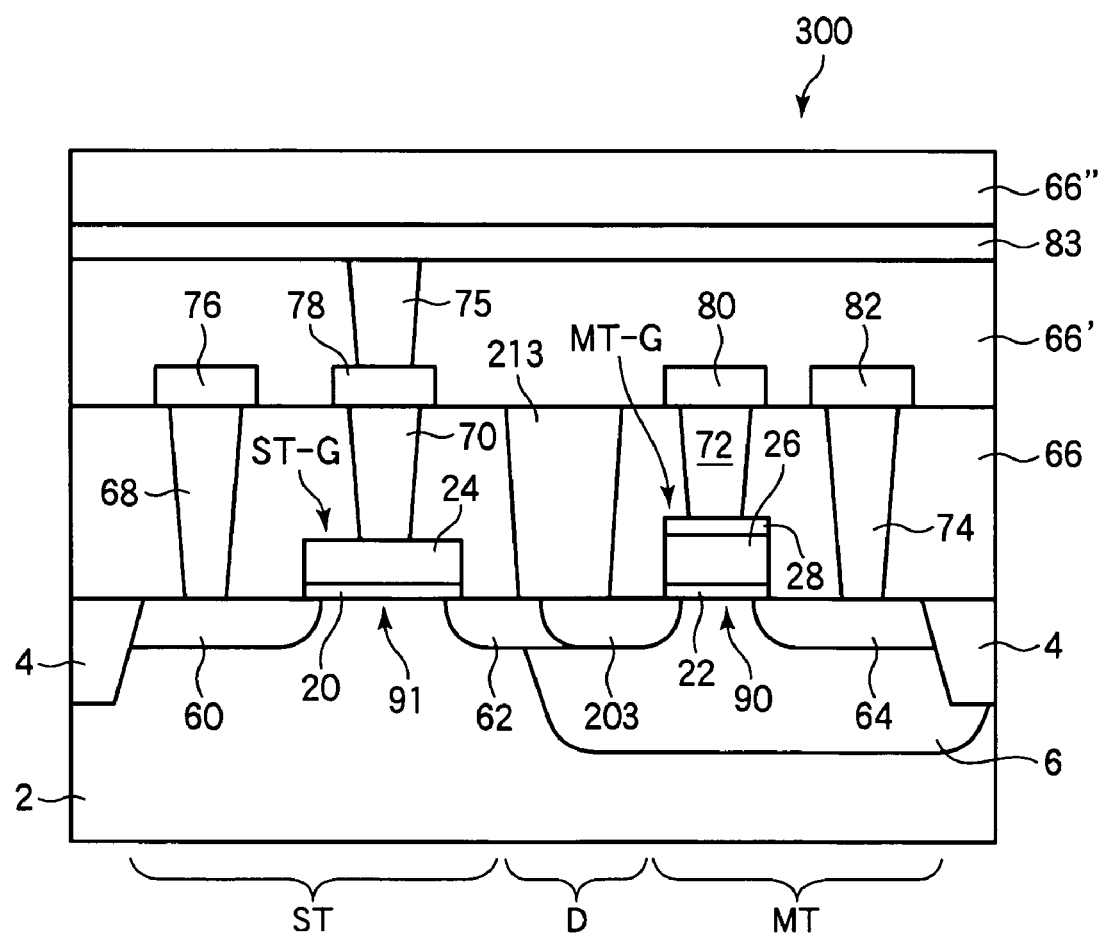
FIG. 25 is a view showing a sectional structure, perpendicular to a substrate surface, of one memory cell of a semiconductor storage device 300 according to a fourth embodiment of the invention, and the semiconductor storage device 300 includes a transistor-type ferroelectric storage element MT provided with a ferroelectric film, a pn junction diode D and a cell selection transistor ST are connected to one another.

A semiconductor storage device according to a fourth embodiment of the invention, a data writing method thereof, a data reading method thereof, and a manufacturing method thereof will be described with reference to FIG. 25 and FIG. 26. FIG. 25 shows a sectional structure, perpendicular to the substrate surface, of one memory cell of a semiconductor storage device 300 in which a transistor-type ferroelectric storage element MT provided with a ferroelectric film, a pn junction diode D and a cell selection transistor ST are connected to one another. As shown in FIG. 25, the memory cell of the semiconductor storage device 300 is characterized in that a tungsten plug (metal layer) 213 to connect a cathode region 62 of the pn junction diode D and an anode region 203 is provided. An interlayer insulating film 66 of an upper layer of the cathode region 62 and the anode region 203 is opened, and a contact hole is formed. The tungsten plug 213 is formed to be embedded in the contact hole, and is electrically connected to the cathode region 62 and the anode region 203. Since the semiconductor storage device 300 has the same structure as the semiconductor storage device 200 of the third embodiment, except that the tungsten plug 213 is provided, its description will be omitted.

Next, the data writing/reading method of the semiconductor storage device 300 of this embodiment will be described. In the semiconductor storage device 300 of this embodiment, a part of the cathode region 62 is formed on the n⁻ well 6, and the cathode region 62 and the n⁻ well 6 are electrically connected. Thus, the semiconductor storage device 300 can write data by the same method as that of the first to the third embodiments.

Since the data reading method of the semiconductor storage device 300 of this embodiment is almost equal to that of the second and the third embodiments, only a different point will be described in brief. The tungsten plug 213 is connected in parallel to the pn junction diode D, and functions as a resistance element having a very low resistance value which can be regarded as 0. Accordingly, the memory cell of the semiconductor storage device 300 has the structure in which the transistor-type ferroelectric storage element MT is connected in series to a parallel circuit of the tungsten plug 213 and the pn junction diode D.

In the semiconductor storage device 300, at the time of reading of the 1-bit data corresponding to "0", the transistor-type ferroelectric storage element MT is put in a state of $(p^+)(n^-)(p^+)$. Accordingly, irrespective of the current-voltage characteristic of the pn junction diode D at the time of reverse bias, a current hardly flows through the memory cell by the transistor-type ferroelectric storage element MT. On the other hand, in the semiconductor storage device 300, at the time of reading of the 1-bit data corresponding to "1", the transistor-type ferroelectric storage element MT is put in a state of $(p^+)(p)(p^+)$ and a current flows. Even if the pn junction diode D does not have the reverse conduction characteristic, since the current flows through the tungsten plug 213 connected in parallel to the pn junction diode D, a relatively large current flows through the memory cell. Accordingly, in the semiconductor storage device 300 of this embodiment, a large on/off ratio can be obtained at the time of data reading.

As described above, in this embodiment, since the semiconductor storage device 300 requires the formation region of the tungsten plug 213, the memory cell becomes slightly larger than that of the semiconductor storage device 200 of the third embodiment. However, in the semiconductor storage device 300, even if the cathode region 62 and the anode region 203 are not satisfactorily pn-connected and the reverse conduction characteristic of the pn junction diode D is not obtained, the large on/off ratio can be obtained at the time of data reading by the ohmic conductive characteristic of the tungsten plug 213. Accordingly, the semiconductor storage device 300 of this embodiment can obtain the same effects as those of the second and the third embodiments.

Next, the manufacturing method of the semiconductor storage device 300 of this embodiment will be described in brief. Since the manufacturing method of this embodiment is almost equal to that of the third embodiment, only a different process will be described in brief. Portions up to the interlayer insulating film 66 are formed by the same manufacturing method as that of the third embodiment. Next, when contact holes are formed in the interlayer insulating film 66 of the upper layer part of the gate electrode 28 and the like in the first embodiment (see FIG. 13), at the same time, a contact hole is formed in the interlayer insulating film 66 of an upper layer part of the cathode region 62 and the anode region 203. Thereafter, as shown in FIG. 25, tungsten plugs 68, 70, 72, 74 and 213 are formed through the same manufacturing process as that of the first embodiment. Thereafter, the semiconductor storage device 300 is completed through the same manufacturing process as that of the first embodiment.

Next, a memory array structure of the semiconductor storage device of this embodiment will be described with reference to FIG. 26. FIG. 26 shows an example of a plane layout of the semiconductor storage device 300 including a 2 rows by 2 columns memory cell array. The gate insulating film 22, the ferroelectric film 26 and the gate electrode 28 constituting the gate portion MT-G and the tungsten plug 72 on the gate electrode 28 shown in FIG. 25 are not shown in FIG. 26. Further, the gate insulating film 20 and the gate electrode 24 constituting the gate portion ST-G, and the tungsten plug 70 on the gate electrode 24 shown in FIG. 25 are not shown in FIG. 26. Besides, the memory array of the semiconductor storage device 300 has the structure in which the tungsten plug 75 on the wiring line 78, the wiring line 83 and the interlayer insulating film 66" shown in FIG. 25 are not included.

Figure 26:
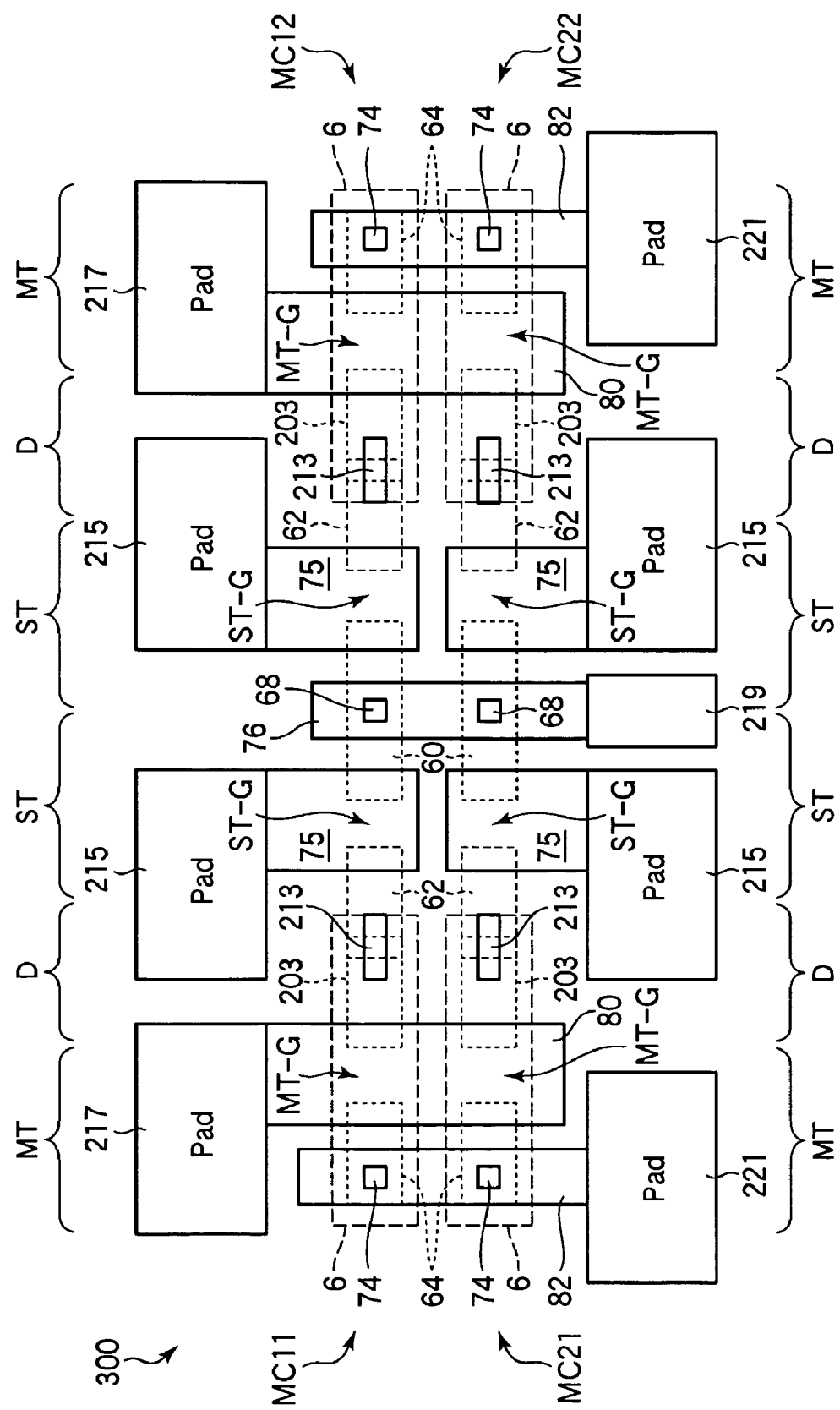
FIG. 26 is a plane layout view of a 2 rows by 2 columns memory cell array of the semiconductor storage device 300 according to the fourth embodiment of the invention.
Figure 27:
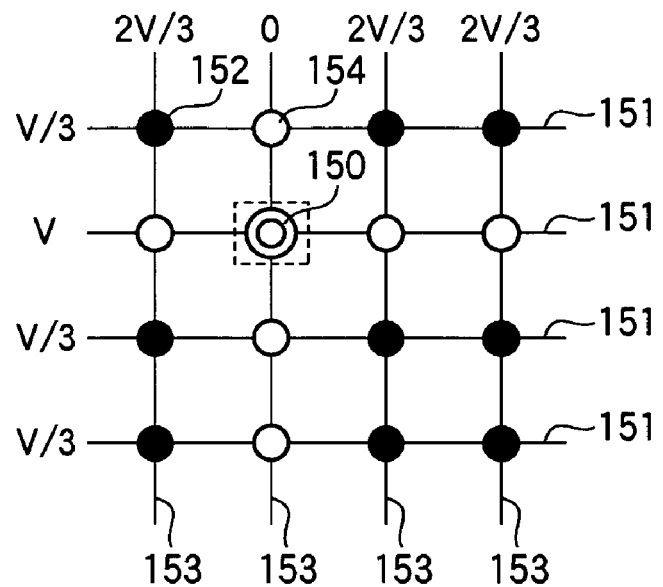
FIG. 27 is a view for explaining data writing of a memory array of a conventional FET-type 1T FeRAM.
Figure 28A:
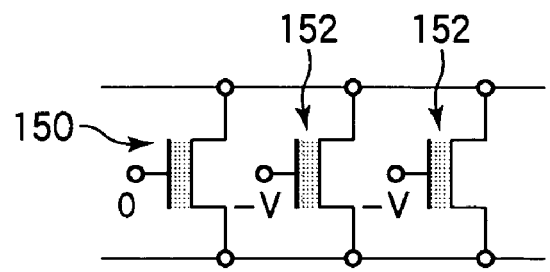
FIGS. 28A and 28B are views for explaining data reading of a memory array of a conventional FET-type 1T FeRAM.
Figure 28B:
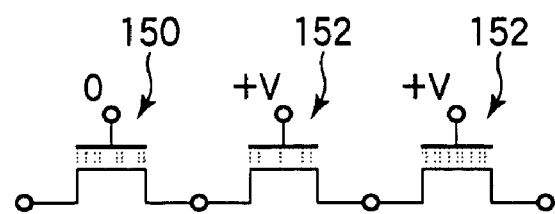

As shown in FIG. 26, the contact hole is formed to extend over the upper layer parts of the cathode region 62 and the anode region 203 so that the tungsten plug 213 is connected to both the cathode region 62 and the anode region 203. The tungsten plug 213 is formed to be embedded in the contact hole.

The memory array of the semiconductor storage device 300 is characterized in that the drain/source region 60 is shared by memory cells at two columns, and high integration is realized. The drain/source region 60 is shared by the memory cell MC11 and the memory cell MC12, and the drain/source region 60 is shared by the memory cell MC21 and the memory cell MC22. Further, in the memory array of the semiconductor storage device 300, a wiring line 76 connected to the respective drain/source regions 60 and a pad 219 which is connected to the wiring line 76 and to which a data voltage is applied are also shared.

A wiring line 75 of each of the memory cells MC11, MC12, MC21 and MC22 is connected to a pad 215 to which a voltage for cell selection is inputted. In the memory array of the semiconductor storage device 300, the wiring lines 75 of the memory cells MC11, MC12, MC21 and MC22 are respectively connected to the different pads 215, so that the memory cell into which data is written or from which data is read can be independently selected. A wiring line 80 of the memory cell MC11 and the memory cell MC21 is shared and is connected to a pad 217. Further, a wiring line 82 of the memory cell MC11 and the memory cell MC21 is shared and is connected to a pad 221. Similarly, a wiring line 80 of the memory cell MC12 and the memory cell MC22 is shared and is connected to a pad 217. Further, a wiring line 82 of the memory cell MC12 and the memory cell MC22 is shared and is connected to a pad 221. A voltage to be applied to the gate electrode (not shown) of the gate portion MT-G is inputted to the pad 217. The pad 221 is put in an open state at the time of data writing, and is connected to the ground at the time of data reading.

As described above, in the memory array of the semiconductor storage device of this embodiment, since the drain/source region 60 and the wiring line 76 are shared by the memory cells at two columns, high integration can be realized. Besides, the semiconductor storage device 300 is not limited to the 2 rows by 2 columns memory cell, and it is a matter of course that an m rows by n columns memory cell array may be adopted.

The invention is not limited to the embodiments, and various modifications can be made. In the first embodiment, although the n⁻ well 6 is formed in the p-type silicon semiconductor substrate 2, the invention is not limited to this. For example, it is a matter of course that a p⁻ well is formed in an n-type silicon semiconductor substrate, and a cell selection transistor ST of a p-type MOSFET may be formed. In this case, in FIG. 1, a drain region of a high concentration p-type impurity region is formed at the formation position of the drain region 60 of the cell selection transistor ST, an anode region (high concentration p-type impurity region) serving also as a source region of the cell selection transistor ST is formed at the formation position of the cathode region 62 of the pn junction diode GD with the ferroelectric gate, and a cathode region (high concentration n-type impurity region) is formed at the formation position of the anode region 64.

Setting of the respective lines WL, BL, DL and PL of data writing/reading in the semiconductor storage device of this structure is as follows. When 1-bit data corresponding to "0" is written into the memory cell, a voltage of −V0 (V) is applied to the word line WL, a voltage of 0 (V) is applied to the bit line BL, a voltage of −V1 (V) is applied to the drive line DL, and the plate line PL is put in the open state. By this, since the polarization direction of the ferroelectric film becomes the direction directed from the semiconductor substrate to the gate electrode, the surface of the ferroelectric film for data storage on the semiconductor substrate side is negatively (−) charged, positive holes are collected in the inversion layer formation region 90 and the inversion layer is not formed.

On the other hand, when 1-bit data corresponding to "1" is written into the memory cell of the structure, a voltage of −V0 (V) is applied to the word line WL, a voltage of −V1 (V) is applied to the bit line BL, a voltage of 0 (V) is applied to the drive line DL, and the plate line PL is put in the open state. By this, since the polarization direction of the ferroelectric film becomes the direction directed from the gate electrode to the semiconductor substrate, the surface of the ferroelectric film for data storage on the semiconductor substrate side is positively (+) charged, electrons are collected in the inversion layer formation region 90 and the n-type inversion layer is formed. Accordingly, also in the semiconductor storage device of this structure, the 1-bit data corresponding to "0" or "1" can be written into the pn junction diode GD with the ferroelectric gate.

When the 1-bit data corresponding to "0" or "1" is read from the memory cell of this structure, a voltage of −V0 (V) is applied to the word line WL, a voltage of −Vr (V) is applied to the bit line BL, a voltage of 0 (V) is applied to the drive line DL, and the plate line PL is kept at 0 (V).

When the 1-bit data corresponding to "0" has been written in the memory cell, since the inversion layer is not formed, the pn junction diode GD with the ferroelectric gate can be regarded as a p⁻ n⁺ junction diode in which the p⁻ well and the cathode region are connected. Since the breakdown voltage of the p⁻n⁺ junction diode is relatively large, even if a reverse bias voltage −Vr (V) is applied, only a very small reverse current I0 (mA) which can be regarded as 0 flows. On the other hand, when the 1-bit data corresponding to "1" has been written in the memory cell, since the n-type inversion layer is formed, the pn junction diode GD with the ferroelectric gate can be regarded as the p⁺n⁺ junction diode in which the cathode region (n⁺) and the anode region (p⁺) are connected through the n⁺-type inversion layer. The withstand voltage between the high concentration anode region and the n⁺-type inversion layer is lower than the withstand voltage between the cathode region having the high concentration n-type impurity diffusion layer and the p⁻ well including the inversion layer formation region in a part thereof. Thus, when a reverse bias voltage of −Vr (V) is applied, a very large reverse current I1 (mA) as compared with the reverse current I0 flows through the pn junction diode GD with the ferroelectric gate. Accordingly, also in the semiconductor storage device of this structure, the 1-bit data corresponding to "0" or "1" can be read by determining the magnitude of the reverse current flowing through the pn junction diode GD with the ferroelectric gate.

Besides, in the second embodiment, although the n⁻ well 6 is formed in the p-type silicon semiconductor substrate 2, the invention is not limited to this. For example, it is a matter of course that a p⁻ well is formed in an n-type silicon semiconductor substrate, and an n-type transistor-type ferroelectric storage element MT and a cell selection transistor ST of a p-type MOSFET may be formed. In this case, in FIG. 19, a drain region (high concentration n-type impurity region) serving also as a cathode region of a pn junction diode D is formed at the formation position of the drain region 94 of the transistor-type ferroelectric storage element MT, an anode region (high concentration p-type impurity region) serving also as a source region of a cell selection transistor ST is formed at the formation position of the cathode region 62 of the pn junction diode D, and a drain region of a high concentration p-type impurity region is formed at the formation position of the drain region 60 of the cell selection transistor ST.

In the semiconductor storage device of this structure, when the respective lines WL, BL, DL and PL are set similarly to the semiconductor storage device in which the p⁻ well is formed in the n-type silicon semiconductor substrate, data writing/reading can be performed.

In the fourth embodiment, although the tungsten plug 213 of the semiconductor storage device 300 is formed to be embedded in the contact hole of the interlayer insulating film 66, the invention is not limited to this. For example, even when, instead of the tungsten plug 213, a metal layer is directly formed on the cathode region 62 and the anode region 203, the same effects as those of the fourth embodiment can be obtained.

In the fourth embodiment, although the semiconductor storage device 300 includes the pn junction diode D including the cathode region 62 and the anode region 203, the invention is not limited to this. For example, the cathode region 62 and the anode region 203 are formed to be isolated from each other, and the pn junction diode D may not be formed. When the cathode region 62 and the anode region 203 are respectively electrically connected to the n⁻ well 6, and the cathode region 62 and the anode region 203 are electrically connected by the tungsten plug 213, the same effects as those of the fourth embodiment can be obtained.

In the semiconductor storage devices 200 and 300 of the third and the fourth embodiments, although the first conductivity type is the p type, and the second conductivity type is the n type, the invention is not limited to this. Even when the first conductivity is the n type, and the second conductivity is the p type, the same effects as those of the third and the fourth embodiments can be obtained.

What is claimed is:

1. A semiconductor element comprising:
   a ferroelectric film formed above a semiconductor substrate;
   a gate electrode formed on the ferroelectric film;

a first n-type impurity activated region formed below the ferroelectric film and having a first impurity concentration;

a second n-type impurity activated region formed on one of both sides of the first n-type impurity activated region, wherein one part thereof is arranged inside the first n-type impurity activated region and the other part thereof is arranged outside the first n-type impurity activated region, and wherein a second impurity concentration of the second n-type impurity activated region is higher than the first impurity concentration; and a p-type impurity activated region formed on the other of both the sides and having a third impurity concentration.

2. The semiconductor element according to claim 1, wherein the impurity activated region includes an inversion layer formation region in which an inversion layer is formed according to a polarization direction of the ferroelectric film.

3. The semiconductor element according to claim 1, further comprising a gate insulating film between the inversion layer formation region and the ferroelectric film.

4. The semiconductor element according to claim 3, wherein the gate insulating film is made of one selected from the group consisting essentially of $HfO_2$, $HfAlO_x$, $HfSiO_x$ and $HfSiNO_x$.

5. The semiconductor element according to claim 1, wherein the ferroelectric film is made of one selected from the group consisting essentially of SBT, BLT, PGO, BFO, STN and BNMO.

6. The semiconductor element according to claim 1, wherein the gate electrode is made of one selected from the group consisting essentially of Pt, Ir, $IrO_2$, SRO and $RuO_2$.

7. A semiconductor storage device comprising a memory cell to store data according to a polarization direction of a ferroelectric film, wherein the memory cell includes:

the semiconductor element according to one of claims 1 to 6; and a cell selection transistor including a gate electrode, a source region, and a drain region, and one of the p-type impurity activated region and the n-type impurity activated region is connected to one of the source region and the drain region.

8. A semiconductor storage device comprising a memory cell to store data according to a polarization direction of a ferroelectric film, wherein the memory cell includes a semiconductor element that includes:

a ferroelectric film formed above a semiconductor substrate;

a gate electrode formed on the ferroelectric film;

an inversion layer formation region in which an inversion layer is formed in the semiconductor substrate below the ferroelectric film according to the polarization direction of the ferroelectric film;

a cathode region formed on one of both sides of the inversion layer formation region;

an anode region formed on the other of both the sides; and an impurity activated region formed below the anode region, the ferroelectric film and the cathode region, wherein one part of the cathode region is arranged inside the impurity activated region and the other part of the cathode region is arranged outside the impurity activated region, and a cell selection transistor that includes:

a gate insulating film formed on the semiconductor substrate;

a gate electrode formed on the gate insulating film; and a source region and a drain region formed on both sides of a channel region of the semiconductor substrate in a lower layer of the gate insulating film, and one of the cathode region and the anode region of the semiconductor element is electrically connected to one of the source region and the drain region of the cell selection transistor.

9. The semiconductor storage device according to claim 8, wherein one of the cathode region and the anode region of the semiconductor element is formed integrally with one of the source region and the drain region.

10. The semiconductor storage device according to claim 9, further comprising:

a word line to apply a cell selection signal to the gate electrode of the cell selection transistor;

a bit line to output 1-bit data to the drain region;

a plate line to cause the anode region of the semiconductor element to become open or to have a reference potential; and a drive line to apply an applied voltage to the gate electrode of the semiconductor element.

11. The semiconductor storage device according to claim 8, wherein the cell selection transistor is an n-type MOSFET, and each of the source region, the drain region and the cathode region includes a high concentration n-type impurity diffusion layer.

12. The semiconductor storage device according to claim 8, wherein the semiconductor substrate is an SOI substrate.

13. The semiconductor storage device according to claim 8, further comprising an impurity diffusion region of a conductivity type opposite to the cathode region between the cathode region and the inversion layer formation region.

14. A data writing method of a semiconductor storage device including a memory cell to store data according to a polarization direction of a ferroelectric film, comprising:

applying a gate voltage to a gate electrode formed on the ferroelectric film formed above a semiconductor substrate;

applying a data voltage corresponding to the data to a cathode region formed on one of both sides of an inversion layer formation region in which an inversion layer is formed in the semiconductor substrate below the ferroelectric film according to the polarization direction of the ferroelectric film;

opening an anode region formed in the other of both the sides; and writing the data into the ferroelectric film by changing the polarization direction based on a magnitude of the data voltage relative to the gate voltage.

15. A data reading method of a semiconductor storage device including a memory cell to store data according to a polarization direction of a ferroelectric film, comprising:

applying, according to the polarization direction of the ferroelectric film, a reverse bias voltage between a cathode region formed on one of both sides of an inversion layer region formed below the ferroelectric film and an anode region formed on the other of both the sides;

reading the data stored in the ferroelectric film based on a magnitude of a current flowing between the cathode region and the anode region, wherein one part of the cathode region is arranged inside a impurity activated region that includes the inversion layer region and the other part of the cathode region is arranged outside the impurity activated region; and the impurity activated region has a conductivity type the same as a conductivity type of the cathode region.

16. A manufacturing method of a semiconductor storage device including a memory cell to store data according to a polarization direction of a ferroelectric film, wherein the memory cell is formed by:
- forming a semiconductor element by forming a ferroelectric film above an impurity activated region formed in a semiconductor substrate, forming a gate electrode on the ferroelectric film, forming a cathode region on one of both sides of an inversion layer formation region in the impurity activated region below the ferroelectric film, wherein one part thereof is formed inside the impurity activated region and the other part thereof is formed outside the impurity activated region, and forming an anode region on the other of both the sides on the impurity activated region;
- forming a cell selection transistor by forming a gate insulating film on the semiconductor substrate, forming a gate electrode on the gate insulating film, and forming a source region and a drain region on both sides of a channel region of the semiconductor substrate in a lower layer of the gate insulating film; and
- connecting one of the cathode region and the anode region to one of the source region and the drain region.

17. A semiconductor storage device comprising a memory cell to store data according to a polarization direction of a ferroelectric film, wherein the memory cell includes:
- a storage semiconductor element that includes a well region formed in a semiconductor substrate of a first conductivity type and having a second conductivity type different from the first conductivity type, a ferroelectric film formed above the well region, a gate electrode formed on the ferroelectric film, an inversion layer formation region in which an inversion layer is formed in the well region below the ferroelectric film according to the polarization direction of the ferroelectric film, a first impurity activated region of the first conductivity type formed on one of both sides of the inversion layer formation region, and a second impurity activated region of the first conductivity type formed on the other of both the sides;
- a cell selection transistor that includes a gate insulating film formed on the semiconductor substrate, a gate electrode formed on the gate insulating film, a third impurity activated region of the second conductivity type formed on one of both sides of a channel region of the semiconductor substrate in a lower layer of the gate insulating film, wherein the third impurity activated region directly comes in contact with each of the well region and the second impurity activated region, and a fourth impurity activated region of the second conductivity type formed on the other of both the sides of the channel region, and wherein one part of the third impurity activated region is arranged inside the well region and the other part of the third impurity activated region is arranged outside the well region.

18. The semiconductor storage device according to claim 17, further comprising a gate insulating film between the inversion layer formation region and the ferroelectric film.

19. The semiconductor storage device according to claim 17, wherein the second and the third impurity activated regions have relatively high impurity concentrations and constitute a reverse conduction diode.

20. The semiconductor storage device according to claim 17, further comprising a metal layer formed on the second and the third impurity activated regions and electrically connecting the second and the third impurity activated regions.

* * * * *